(12) United States Patent
Kamada

(10) Patent No.: US 8,962,427 B2
(45) Date of Patent: Feb. 24, 2015

(54) METHOD OF PRODUCING SEMICONDUCTOR DEVICE

(71) Applicant: Fujitsu Limited, Kawasaki-shi (JP)

(72) Inventor: Yoichi Kamada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/109,865

(22) Filed: Dec. 17, 2013

(65) Prior Publication Data

US 2014/0106527 A1 Apr. 17, 2014

Related U.S. Application Data

(62) Division of application No. 13/397,028, filed on Feb. 15, 2012, now Pat. No. 8,637,904.

(30) Foreign Application Priority Data

Feb. 24, 2011 (JP) ................................. 2011-038922

(51) Int. Cl.
*H01L 29/66* (2006.01)
*H01L 29/207* (2006.01)
*H01L 29/778* (2006.01)
*H03F 1/32* (2006.01)
*H03F 3/189* (2006.01)
*H03F 3/24* (2006.01)
*H01L 21/28* (2006.01)
(Continued)

(52) U.S. Cl.
CPC ........ *H01L 29/66666* (2013.01); *H01L 29/207* (2013.01); *H01L 29/66462* (2013.01); *H01L 29/7787* (2013.01); *H03F 1/3247* (2013.01); *H03F 3/189* (2013.01); *H03F 3/24* (2013.01); *H01L 21/28264* (2013.01); *H01L 29/517* (2013.01); *H01L 29/518* (2013.01); *H01L 29/2003* (2013.01); *H01L 29/4236* (2013.01); *H03F 2200/204* (2013.01); *H03F 2200/451* (2013.01)
USPC ......................................... 438/270

(58) Field of Classification Search
USPC ......................................... 438/270
See application file for complete search history.

(56) References Cited

U.S. PATENT DOCUMENTS 5,597,444 A * 1/1997 Gilton ........................... 438/710
6,432,318 B1 8/2002 Ding et al.
(Continued)

FOREIGN PATENT DOCUMENTS

JP 2002-359256 A1 12/2002
JP 2003-092270 A 3/2003
(Continued)

OTHER PUBLICATIONS

Japanese Office Action dated Dec. 2, 2014, in the corresponding Japanese Patent Application No. 2011-038922 with English translation.

*Primary Examiner* — Thao P Le
(74) *Attorney, Agent, or Firm* — Kratz, Quintos & Hanson, LLP

(57) ABSTRACT

A method of producing a semiconductor device, includes: forming a semiconductor layer on a substrate; forming an a recess in the semiconductor layer by dry etching with a gas containing fluorine components, the recess having an opening portion on the surface of the semiconductor layer; forming a fluorine-containing region by heating the semiconductor layer and thus diffusing, into the semiconductor layer, the fluorine components attached to side surfaces and a bottom surface of the recess; forming an insulating film on an inner surface of the recess and on the semiconductor layer; and forming an electrode on the insulating film in a region in which the recess is formed.

15 Claims, 23 Drawing Sheets

(51) Int. Cl.
*H01L 29/51* (2006.01)
*H01L 29/20* (2006.01)
*H01L 29/423* (2006.01)

(56) References Cited

U.S. PATENT DOCUMENTS

| | | | |
|---|---|---|---|
| 7,732,344 B1 * | 6/2010 | Tsai et al. | 438/734 |
| 2007/0249119 A1 | 10/2007 | Saito | |
| 2012/0115329 A1 * | 5/2012 | Chandrashekar et al. | 438/675 |
| 2012/0156862 A1 * | 6/2012 | Riley et al. | 438/478 |
| 2012/0264307 A1 | 10/2012 | Kundalgurki et al. | |
| 2013/0189907 A1 | 7/2013 | Kubo et al. | |

FOREIGN PATENT DOCUMENTS

| | | |
|---|---|---|
| JP | 2007-294528 A | 11/2007 |
| JP | 2010-010584 A | 1/2010 |

* cited by examiner

METHOD OF PRODUCING SEMICONDUCTOR DEVICE

CROSS-REFERENCE TO RELATED APPLICATION

This application is a Divisional Application of prior application Ser. No. 13/397,028 filed on Feb. 15, 2012, which is based upon and claims the benefit of priority from the prior Japanese Patent Application NO. 2011-038922 filed on Feb. 24, 2011, the entire contents of each of the above of which are incorporated herein by reference.

FIELD

The embodiments disclosed hereafter is related to a method of producing a semiconductor device and a semiconductor device.

BACKGROUND

GaN, AlN, and InN, which are nitride semiconductors, or mixed crystals thereof have a large band gap, and are used for a high-power electronic device, a short-wavelength light emitting device, or other such devices. For the high-power electronic device of these devices, a technique concerning a field effect transistor (FET), particularly, a high electron mobility transistor (HEMT) has been developed. The HEMT made of such nitride semiconductors is used for a high-power and high-efficiency amplifier, a high-power switching device, or other such devices.

The HEMT used for this purpose needs to be normally off and have a high dielectric strength voltage. In particular, normally-off characteristics are important for safe operations, and hence various methods for achieving the normally-off characteristics have been studied. An example of the method for achieving the normally-off characteristics involves removing part of a semiconductor layer located immediately below a gate electrode to thereby form a gate recess. The gate recess structure formed according to this method is advantageous in that a threshold voltage may be positive without an increase in resistance components between electrodes. In addition, a normally-off semiconductor device used for the purpose of electric power is requested to have a high drain withstand voltage and a high gate withstand voltage. Hence, a metal insulator semiconductor (MIS) structure in which an insulating film as a gate insulating film is formed is adopted for lateral FETs and HEMTs. As described above, the gate recess structure and the MIS structure are adopted in combination for the HEMT made of a GaN-based semiconductor material, whereby the semiconductor device suitable for the purpose of electric power may be achieved.

[Patent Document]
Japanese Laid-Open Patent Publication No. 2002-359256.

In the HEMT having the gate recess structure and the MIS structure as described above, a gate leakage current during a transistor operation is suppressed by using aluminum oxide for the gate insulating film. In addition, in order to make the normally-off operation more reliable, fluorine may be implanted into the semiconductor layer in the region in which the gate recess is formed. These methods may enhance characteristics of the HEMT.

Unfortunately, in order to implant fluorine into the semiconductor layer in the region in which the gate recess is formed, a step of implanting fluorine by ion implantation or other such methods needs to be added after the formation of the gate recess, and hence the number of steps is increased, resulting in higher costs. In addition, in the gate recess structure, a trap level is easily formed between the semiconductor layer and the gate insulating film in the gate recess, and electrons are trapped by the trap level, so that the threshold value of a gate voltage fluctuates to be unstable. As a result, the uniformity of semiconductor devices to be produced is reduced, and the yield becomes lower.

SUMMARY

According to an aspect of the embodiments, there is provided a method of producing a semiconductor device, the method including: forming a semiconductor layer on a substrate; forming an opening portion as a recess in the semiconductor layer by dry etching with a gas containing fluorine components; forming a fluorine-containing region by heating the semiconductor layer and thus diffusing, into the semiconductor layer, the fluorine components attached to side surfaces and a bottom surface of the recess; forming an insulating film on an inner surface of the recess and on the semiconductor layer; and forming an electrode on the insulating film in a region in which the recess is formed.

According to an another aspect of the embodiments, there is provided a semiconductor device including: a semiconductor layer formed on a substrate; an opening portion as a recess formed by removing a portion of the semiconductor layer; a fluorine-containing region formed in a portion of the semiconductor layer, the portion corresponding to a bottom surface of the recess; an insulating film formed on an inner surface of the recess and on the semiconductor; and an electrode formed on the insulating film in a region in which the recess is formed. The fluorine-containing region includes: a first fluorine-containing region formed in contact with the bottom surface of the recess; and a second fluorine-containing region formed in the semiconductor layer around the first fluorine-containing region. The first fluorine-containing region has a fluorine concentration higher than that of the second fluorine-containing region.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF THE EMBODIMENTS

Hereinafter, embodiments are described. The same components are denoted by the same reference signs, and description thereof is omitted.
<First Embodiment>
(Semiconductor Device)

Figure 1:
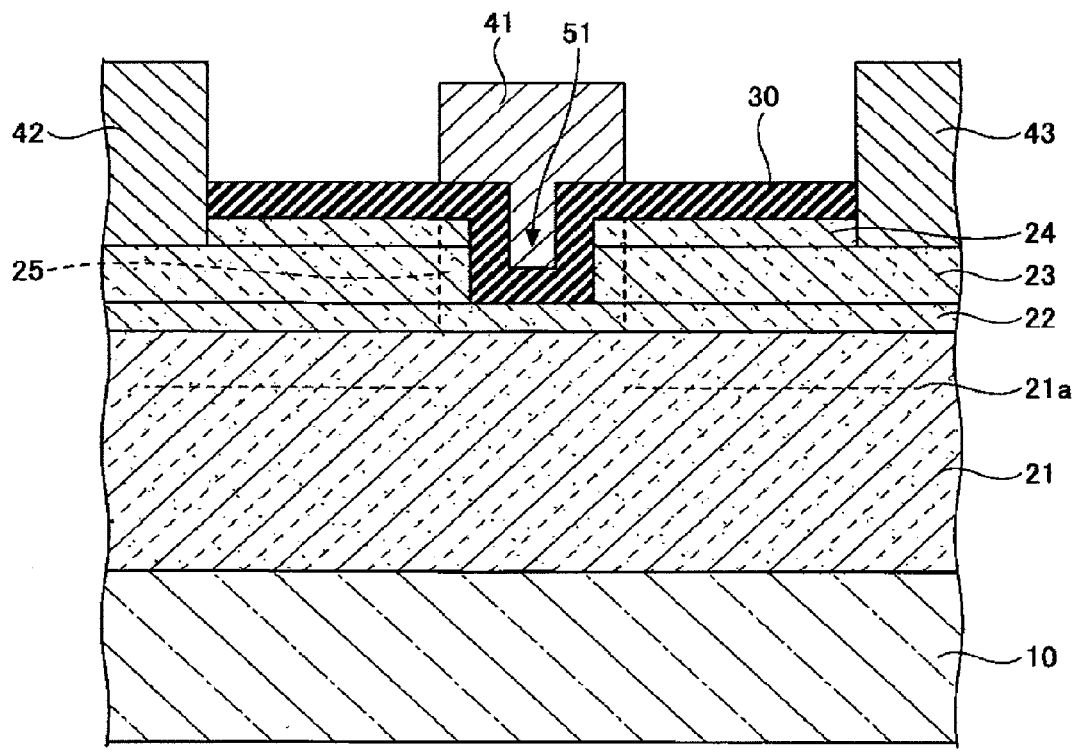
FIG. 1 is a structural view illustrating a semiconductor device according to a first embodiment of the present invention.

With reference to FIG. 1, a semiconductor device according to the present embodiment is described. The semiconductor device according to the present embodiment is a high electron mobility transistor (HEMT). A buffer layer (not illustrated) is formed on a surface of a substrate 10 made of semiconductors and other materials. An electron transit layer 21, a spacer layer 22, an electron supply layer 23, and a cap layer 24 as semiconductor layers are laminated and formed by epitaxial growth on the buffer layer. In addition, an opening portion as a recess 51 is formed in the electron supply layer 23 and the cap layer 24, and an insulating film 30 as a gate insulating film is formed of aluminum oxide and other materials on the cap layer 24 and a bottom surface and side surfaces of the recess 51. A gate electrode 41 is formed on the insulating film 30 in the region in which the recess is formed, and a source electrode 42 and a drain electrode 43 are formed in contact with the electron supply layer 23. Note that the source electrode 42 and the drain electrode 43 may be formed in contact with the electron transit layer 21. In addition, a protecting film may be formed of an insulator on the insulating film 30, the gate electrode 41, the source electrode 42, and the drain electrode 43.

A Si substrate, a SiC substrate, a sapphire ($Al_2O_3$) substrate, and other such substrates are used as the substrate 10. In the present embodiment, a semi-insulating SiC substrate is used as the substrate 10. The electron transit layer 21 as a first semiconductor layer is formed of i-GaN, and the spacer layer 22 as a third semiconductor layer is formed of i-AlGaN. In addition, the electron supply layer 23 as a second semiconductor layer is formed of n-AlGaN, and the cap layer 24 as a fourth semiconductor layer is formed of n-GaN. With this structure, a two-dimensional electron gas (2DEG) 21a is formed in a portion of the electron transit layer 21 near the electron supply layer 23.

The insulating film 30 as the gate insulating film is formed of aluminum oxide ($Al_2O_3$). In addition, the gate electrode 41 is formed of gold or a gold-containing material, and the source electrode 42 and the drain electrode 43 are each formed of a metal material. If it is requested, the protecting film is formed of an insulating film of silicon nitride (SiN) or other such materials.

In the semiconductor device according to the present embodiment, a fluorine (F) containing region 25 is formed in the semiconductor layer in the region in which the recess 51 as the gate recess is formed, that is, a portion of the spacer layer 22 corresponding to the bottom surface of the recess 51. Fluorine is an element having the highest electronegativity among all elements, and fluorine atoms easily become negative ions. Accordingly, if fluorine atoms existing in the fluorine-containing region 25 become negative ions, the number of electrons contained in the 2DEG 21a in the corresponding region becomes smaller, and a region with the smaller number of electrons is formed. Such a region with the smaller number of electrons contained in the 2DEG 21a is formed immediately below the region in which the gate electrode 41 is formed. Hence, an effect produced by such a structure enables a more reliable normally-off operation of the HEMT made of a GaN-based semiconductor material, together with an effect produced by forming the gate recess 51.

(Method of Producing a Semiconductor Device)

Figure 3A:
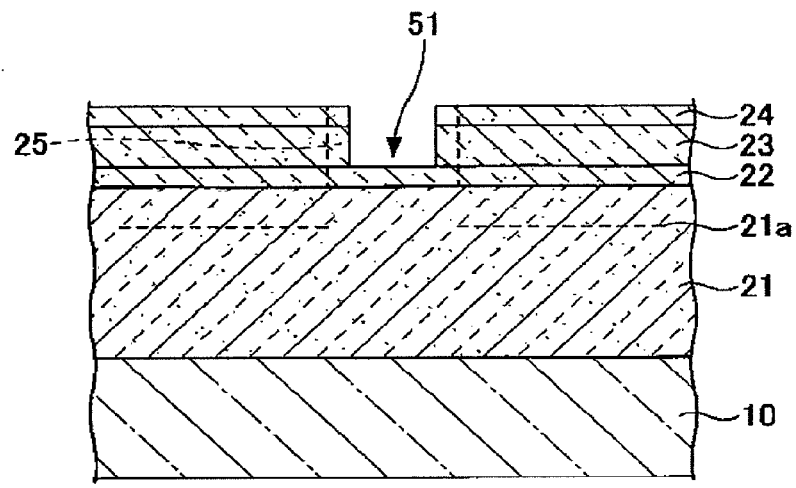
FIGS. 3A, 3B, and 3C are process views (2) each illustrating the method of producing a semiconductor device according to the first embodiment.
Figure 3B:
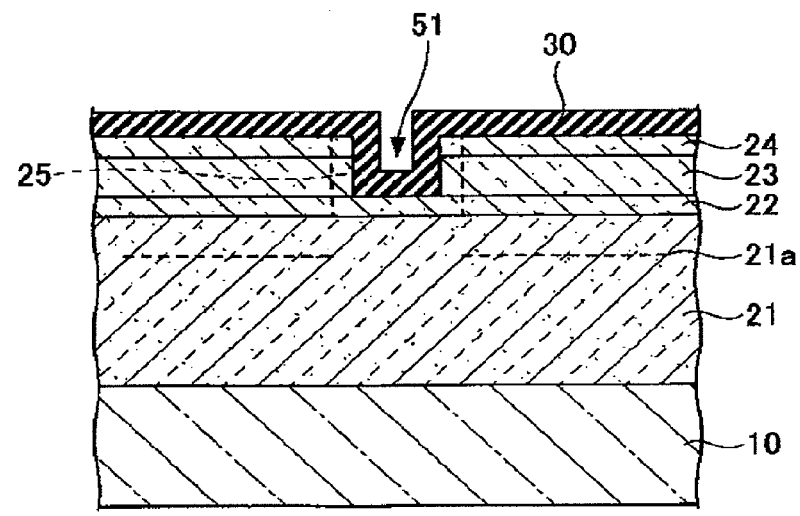
Figure 3C:
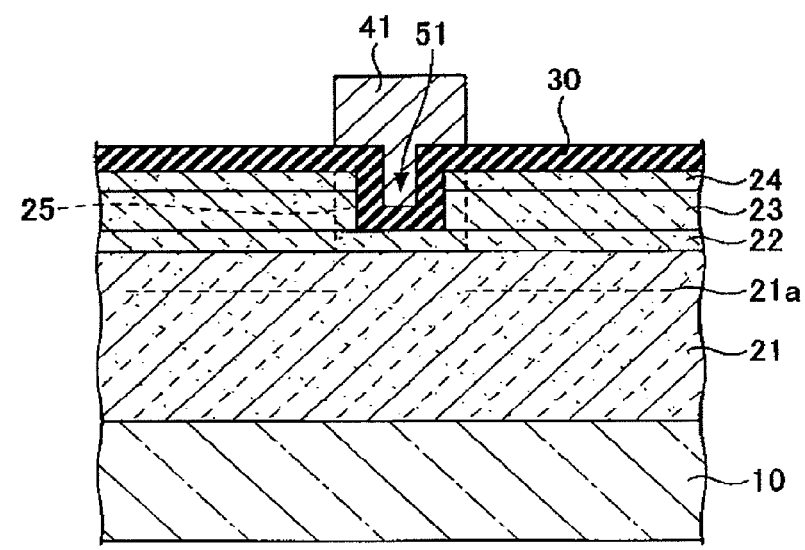
Figure 4:
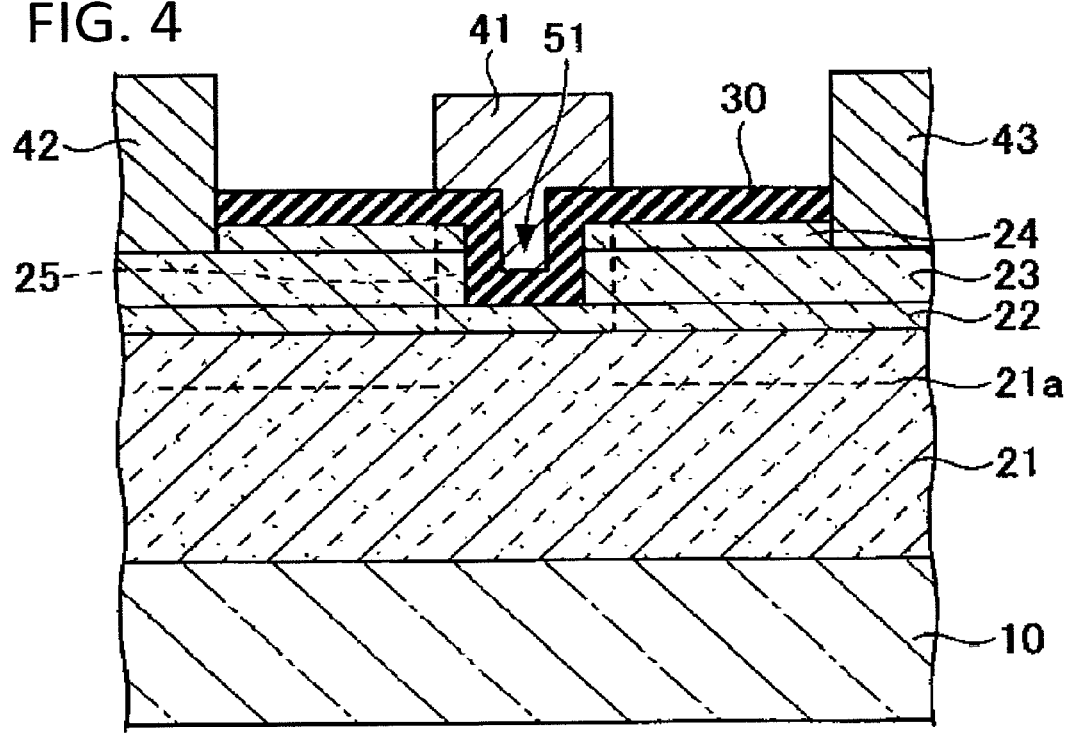
FIG. 4 is a process view (3) illustrating the method of producing a semiconductor device according to the first embodiment.

Next, with reference to FIG. 2 to FIG. 4, a method of producing a semiconductor device according to the present embodiment is described.

Figure 2A:
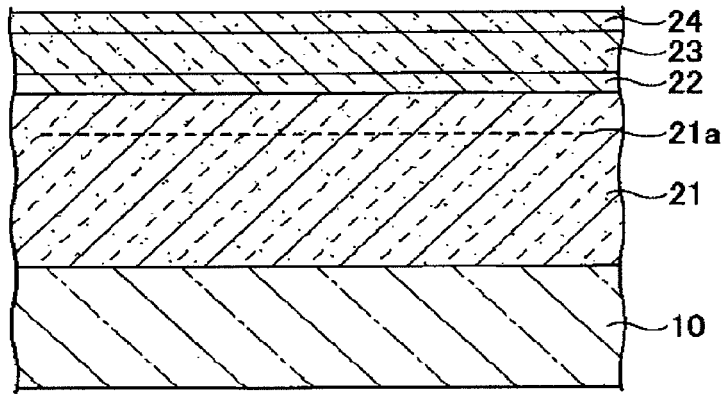
FIGS. 2A, 2B, and 2C are process views (1) each illustrating a method of producing a semiconductor device according to the first embodiment.

First, as illustrated in FIG. 2A, the buffer layer (not illustrated) is formed on the substrate 10 made of semi-insulating SIC and other materials. Further, the electron transit layer 21, the spacer layer 22, the electron supply layer 23, and the cap layer 24 are sequentially formed as the semiconductor layers on the buffer layer. Note that the electron transit layer 21, the spacer layer 22, the electron supply layer 23, and the cap layer 24 as the semiconductor layers are formed by epitaxial growth using metal-organic vapor phase epitaxy (MOVPE). Specifically, the electron transit layer 21 as the first semiconductor layer is formed of i-GaN with a thickness of about 3

μm, and the spacer layer 22 as the third semiconductor layer is formed of i-GaN with a thickness of about 5 nm. The electron supply layer 23 as the second semiconductor layer is formed of n-AlGaN with a thickness of about 30 nm, and is doped with Si as an impurity element such that the impurity concentration thereof is $5\times10^{18}$ cm$^{-3}$. The cap layer 24 as the fourth semiconductor layer is formed of n-GaN with a thickness of about 10 nm, and is doped with Si as an impurity element such that the impurity concentration thereof is $5\times10^{18}$ cm$^{-3}$. With this structure, the 2DEG 21a is formed in the portion of the electron transit layer 21 near an interface between the electron transit layer 21 and the spacer layer 22. After this, an element isolation region, the illustration of which is omitted, is formed. Specifically, photoresist for forming the element isolation region is applied, and exposure and development are performed by an exposure device, whereby a resist pattern is formed so as to have an opening portion in the region in which the element isolation region is to be formed. Further, after this, dry etching is performed using a gas containing chloride components, and an insulating film is formed in the dry-etched region, or ions of a predetermined element are implanted into in the dry-etched region, whereby the element isolation region is formed.

Figure 2B:
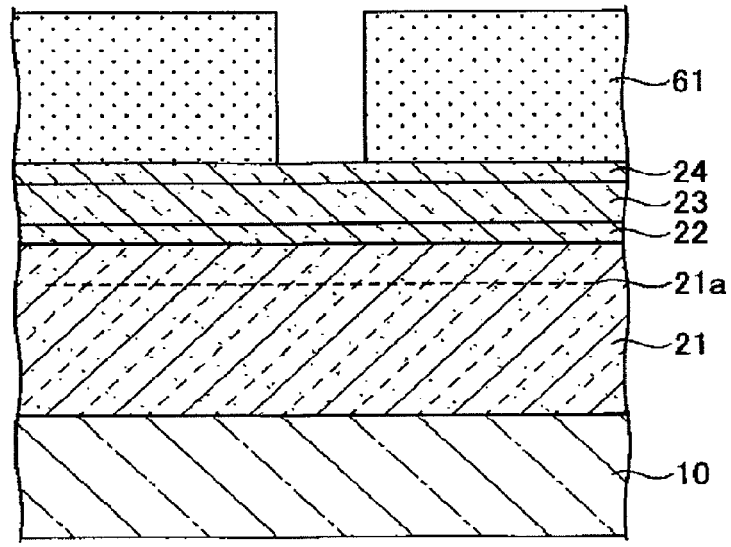

Next, as illustrated in FIG. 2B, a resist pattern 61 is formed on a surface of the cap layer 24. The resist pattern 61 is formed by applying photoresist to the surface of the cap layer 24 and performing exposure and development thereon by the exposure device. As a result, the resist pattern 61 is formed so as to have an opening portion in the region in which the gate recess 51 described later is to be formed.

Figure 2C:
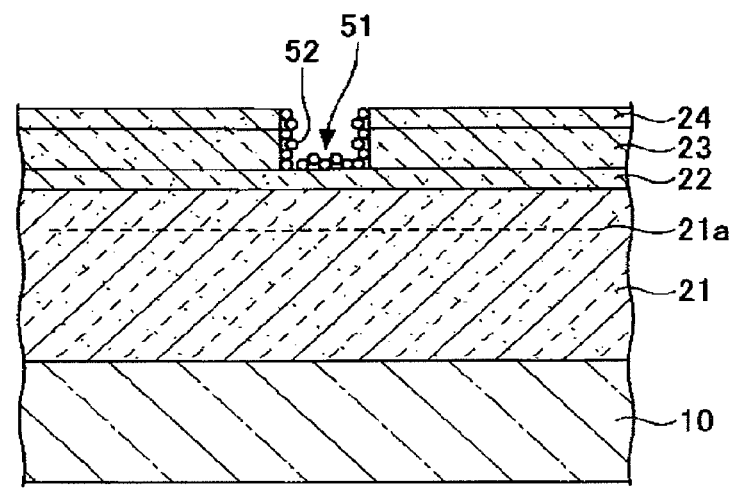

Next, as illustrated in FIG. 2C, dry etching such as reactive ion etching (RIE) is performed. As a result, the cap layer 24 and the electron supply layer 23 in the region in which the resist pattern 61 is not formed are removed, and a surface of the spacer layer 22 is exposed, so that the gate recess 51 is formed. On this occasion, part of the spacer layer 22 may also be removed. The etching gas used for the dry etching such as RIE is fluorine gas (a gas containing fluorine components), and examples of the fluorine gas include $SF_6$, $CF_4$, $C_2F_6$, $C_3F_8$, $CHF_3$, $NF_3$, and $F_2$. In this way, the recess 51 is formed, and fluorine components 52 contained in the fluorine gas used as the etching gas are attached to surfaces of the semiconductor layers corresponding to the side surfaces and the bottom surface of the formed recess 51. After this, the resist pattern 61 is removed using an organic solvent or other such agents.

Figure 5:
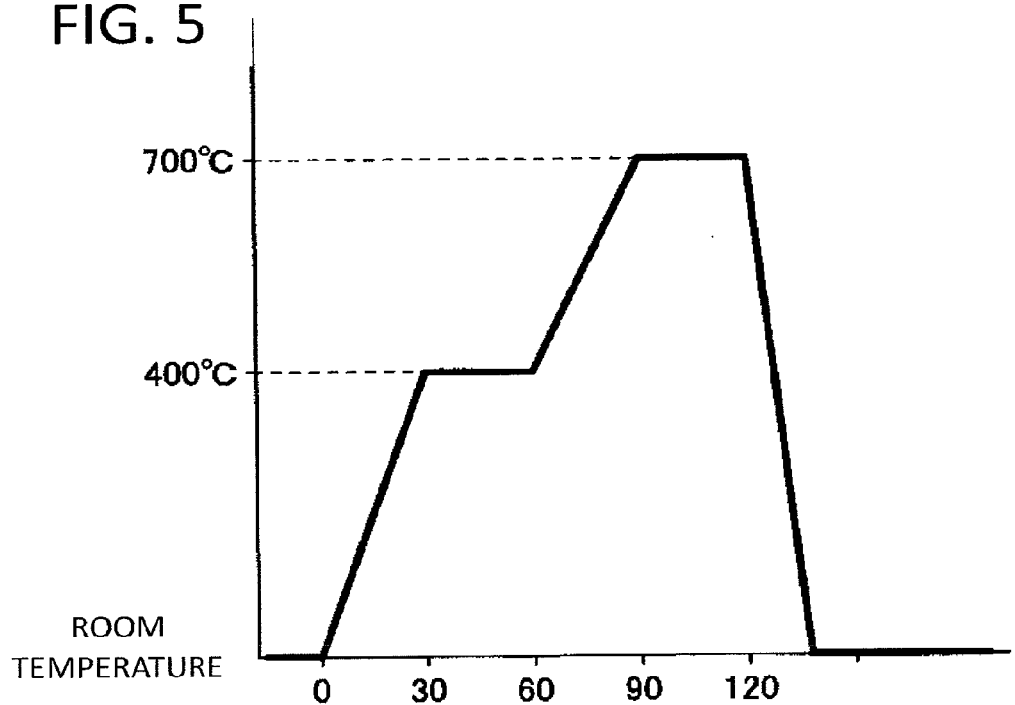
FIG. 5 is an explanatory graph illustrating heat treatment in the method of producing a semiconductor device according to the first embodiment.

Next, as illustrated in FIG. 3A, heat treatment is performed in a nitrogen atmosphere. The heat treatment is performed for 1 to 20 minutes in the range of a temperature between 300° C. and 1,500° C. As a result, the fluorine contained in the fluorine components 52 attached to the surfaces of the semiconductor layers corresponding to the side surfaces and the bottom surface of the recess 51 may be implanted into the semiconductor layers. Specifically, as illustrated in FIG. 5, the heat treatment is performed with the following changes in temperature: increase from room temperature to 400° C. in 30 seconds; keep at 400° C. for 30 seconds; increase from 400° C. to 700° C. in 30 seconds; and keep at 700° C. for 30 seconds. Then, the heating is stopped. Such a gradual increase in temperature may prevent an overshoot at the time of increasing the temperature and thus may lead to uniform and stable heat treatment. As a result, the fluorine contained in the fluorine components 52 attached to the side surfaces and the bottom surface of the recess 51 may be implanted, that is, diffused into the spacer layer 22 and other neighboring layers, so that the fluorine-containing region 25 may be formed. On this occasion, because the fluorine contained in the fluorine components is also attached to the side surfaces of the recess 51, the fluorine may also be implanted into the cap layer 24 and the electron supply layer 23 corresponding to the side surfaces of the recess 51. Note that the fluorine components 52 include, for example, fluorine molecules and compounds containing the fluorine attached to the side surfaces and the bottom surface of the recess 51.

In the present embodiment, a lamp heater of infrared light or other such heat sources is used in the heat treatment, and both surfaces of the substrate 10 or a surface of the substrate 10 on which the recess 51 is formed are/is irradiated with the infrared light to be heated. The lamp heater may rapidly heat the surface(s) of the substrate, and hence fluorine may be intensively implanted into the semiconductor layer corresponding to the bottom surface of the recess 51. In addition, the lamp heater may selectively heat only the surface of the substrate 10 on which the recess 51 is formed. Accordingly, fluorine may be implanted at a high concentration into a narrow region of the semiconductor layers near the recess 51.

Next, as illustrated in FIG. 3B, the insulating film 30 as the gate insulating film is formed on the gate recess 51 and the cap layer 24. Specifically, the insulating film 30 is formed of an aluminum oxide ($Al_2O_3$) film with a thickness of 2 nm to 200 nm. In the present embodiment, the insulating film 30 is formed of an aluminum oxide film with a thickness of about 10 mm. Examples of the method of forming the insulating film 30 include chemical vapor deposition (CVD), atomic layer deposition (ALD), and sputtering. Note that the insulating film 30 may be formed of an oxide, a nitride, or an oxynitride of Si, Al, Hf, Zr, Ti, Ta, and W instead of aluminum oxide described above.

Next, as illustrated in FIG. 3C, the gate electrode 41 is formed on the insulating film 30 in the region in which the gate recess 51 is formed. Specifically, photoresist is applied to the insulating film 30, and exposure and development are performed by the exposure device, whereby a resist pattern (not illustrated) is formed so as to have an opening portion in the region in which the gate electrode 41 is to be formed. After this, a metal film Ni/Au (Ni: 10 nm, Au: 300 nm) is formed by vacuum vapor deposition, and the resultant structure is immersed in an organic solvent or other such agents for a lift-off process, whereby the metal film formed on the resist pattern is removed together with the resist pattern. As a result, the gate electrode 41 is formed of the metal film formed on the insulating film 30 in the region in which the resist pattern is not formed.

Next, as illustrated in FIG. 4, the source electrode 42 and the drain electrode 43 are formed. Specifically, photoresist is applied to the insulating film 30, and exposure and development are performed by the exposure device, whereby a resist pattern (not illustrated) is formed so as to have opening portions in the respective regions in which the source electrode 42 and the drain electrode 43 are to be formed. After this, dry etching such as RIE is performed, the insulating film 30 and the cap layer 24 in the region in which the resist pattern is not formed are removed, and a surface of the electron supply layer 23 is exposed. In the dry etching performed at this time, fluorine gas is used for removing the insulating film 30, and chlorine gas is used for removing the cap layer 24. After this, a metal film made of a laminated film Ta/Al (Ta: 20 nm, Al: 200 nm) is formed by vacuum vapor deposition or other such methods, and the resultant structure is immersed in an organic solvent or other such agents for a lift-off process, whereby the metal film formed on the resist pattern is removed together with the resist pattern. As a result, the source electrode 42 and the drain electrode 43 may be formed of Ta/Al on the electron supply layer 23 in the region in which the resist pattern is not formed. In addition, after the lift-off process, an ohmic contact may be achieved by, for example, performing heat treatment at a temperature of 550° C. Note that, in the above description, the resist pattern for the dry etching doubles as the resist pattern for the lift-off process, but may be formed separately from the resist pattern for the lift-off process. That is, in the above description, the step of forming the resist pattern is performed twice, but the resist pattern for forming the opening region in the insulating film 30 may double as the resist pattern for forming the source electrode 42 and the drain electrode 43. In this case, the step of forming the resist pattern may be performed only once.

In this way, the semiconductor device may be produced using the method of producing a semiconductor device according to the present embodiment.

Figure 6:
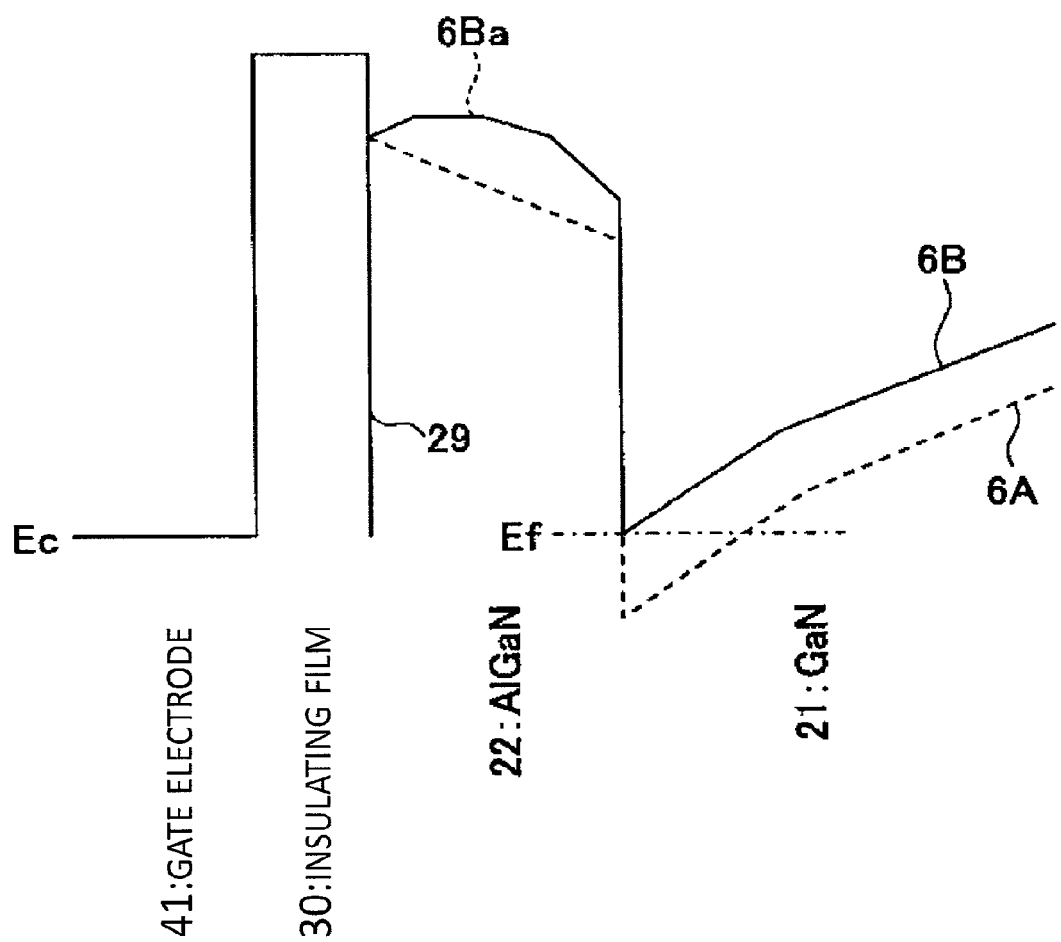
FIG. 6 is an explanatory view illustrating the semiconductor device according to the first embodiment.

FIG. 6 illustrates the state of a conduction band of the gate electrode 41, the insulating film 30 as the gate insulating film, the electron transit layer 21, and the spacer layer 22 in the HEMT corresponding to the semiconductor device. 6A in FIG. 6 indicates the case where fluorine is not implanted, and 6B in FIG. 6 indicates the case of the semiconductor device of the present embodiment in which fluorine is implanted. In the case as indicated by 6B where fluorine is implanted, the conduction band of the electron transit layer 21 and the spacer layer 22 may be brought higher, leading to a more reliable normally-off operation. In addition, in the case where fluorine is implanted, a mountain portion 6Ba is formed in the spacer layer 22. Accordingly, even if a trap level is formed at an interface 29 between the insulating film 30 and the spacer layer 22, electrons of the 2DEG 21a do not enter the interface 29 between the insulating film 30 and the spacer layer 22 without going beyond the mountain portion 6Ba. Hence, the electrons are less likely to be trapped by the trap level. Accordingly, in the case where fluorine is implanted, the number of electrons trapped at the interface 29 between the insulating film 30 and the spacer layer 22 may be smaller than that of the case where fluorine is not implanted, so that fluctuations in the threshold value of the gate voltage may be reduced.

Figure 7:
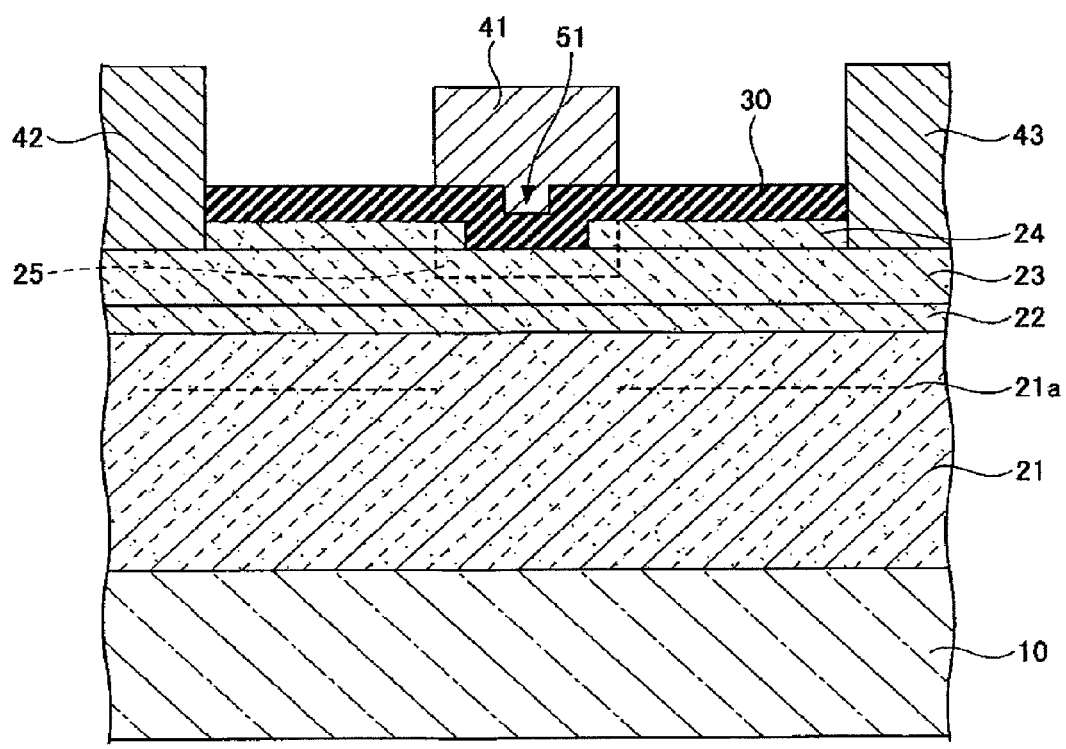
FIG. 7 is a structural view (1) illustrating another semiconductor device according to the first embodiment.
Figure 8:
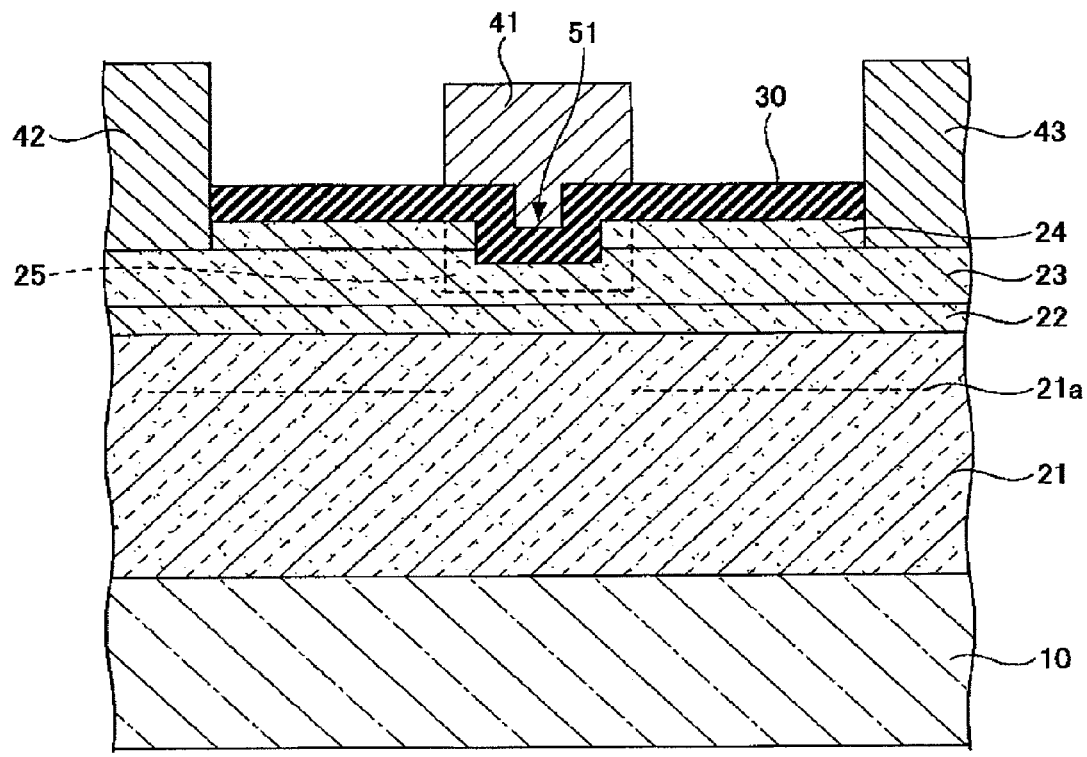
FIG. 8 is a structural view (2) illustrating still another semiconductor device according to the first embodiment.

In addition, the semiconductor device according to the present embodiment may produce a similar effect by means of the fluorine-containing region 25 that is formed in not the spacer layer 22 but the electron supply layer 23 as the semiconductor layer. Specifically, as illustrated in FIG. 7, the recess 51 may be formed by removing only the cap layer 24, and the fluorine-containing region 25 may be formed in the electron supply layer 23 corresponding to the bottom surface of the recess 51. In this case, in the step illustrated in FIG. 2C, the recess 51 is formed by removing the cap layer 24 by RIE or other such methods. Alternatively, as illustrated in FIG. 8, the recess 51 may be formed by removing the cap layer 24 and part of the electron supply layer 23, and the fluorine-containing region 25 may be formed in the electron supply layer 23 corresponding to the bottom surface of the recess 51. In this case, in the step illustrated in FIG. 2C, the recess 51 is formed by removing the cap layer 24 and the part of the electron supply layer 23 by RIE or other such methods.

In this way, the transistor corresponding to the semiconductor device according to the present embodiment may be produced. In the above description, the semiconductor device in which the semiconductor layers are formed of GaN and AlGaN is described, but the present embodiment may be similarly applied to a semiconductor device in which the semiconductor layers are formed of nitride semiconductors such as InAlN and InGaAlN.

<Second Embodiment>

Next, a second embodiment of the present invention is described. In the present embodiment, a semiconductor device similar to the semiconductor device according to the first embodiment is produced using a producing method different from the producing method according to the first embodiment. With reference to FIG. 9 to FIG. 11, the method of producing a semiconductor device according to the present embodiment is described.

Figure 9A:
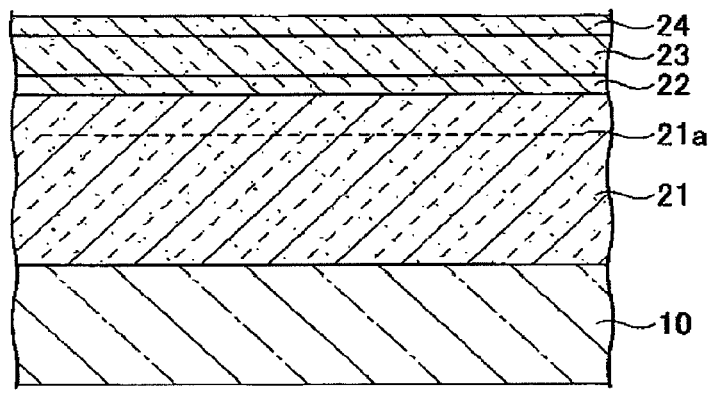
FIGS. 9A, 9B, and 9C are process views (1) each illustrating a method of producing a semiconductor device according to a second embodiment of the present invention.

First, as illustrated in FIG. 9A, the buffer layer (not illustrated) is formed on the substrate 10 made of semi-insulating SiC and other materials. Further, the electron transit layer 21, the spacer layer 22, the electron supply layer 23, and the cap layer 24 are sequentially formed as the semiconductor layers on the buffer layer. Note that the electron transit layer 21, the spacer layer 22, the electron supply layer 23, and the cap layer 24 as the semiconductor layers are formed by epitaxial growth using MOVPE. Specifically, the electron transit layer 21 as the first semiconductor layer is formed of i-GaN with a thickness of about 3 μm, and the spacer layer 22 as the third semiconductor layer is formed of i-GaN with a thickness of about 5 nm. The electron supply layer 23 as the second semiconductor layer is formed of n-AlGaN with a thickness of about 30 nm, and is doped with Si as an impurity element such that the impurity concentration thereof is $5\times10^{18}$ cm$^{-3}$. The cap layer 24 as the fourth semiconductor layer is formed of n-GaN with a thickness of about 10 nm, and is doped with Si as an impurity element such that the impurity concentration thereof is $5\times10^{18}$ cm$^{-3}$. With this structure, the 2DEG 21a is formed in the portion of the electron transit layer 21 near the interface between the electron transit layer 21 and the spacer layer 22. After this, the element isolation region, the illustration of which is omitted, is formed.

Figure 9B:
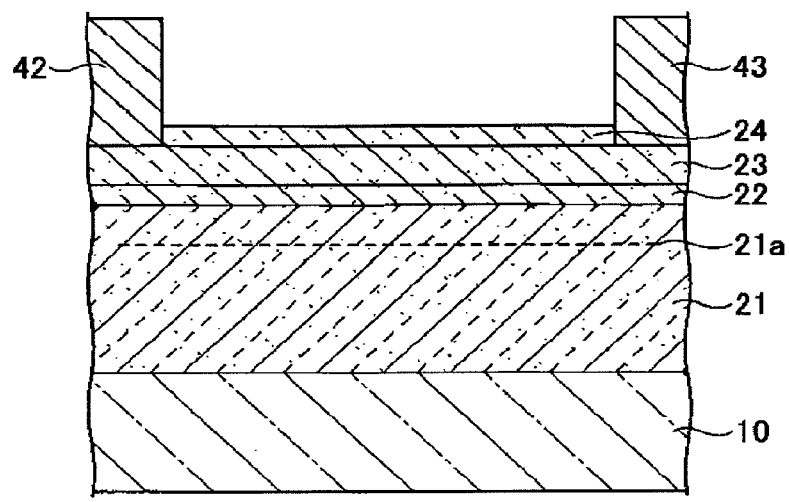

Next, as illustrated in FIG. 9B, the source electrode 42 and the drain electrode 43 are formed. Specifically, photoresist is applied to the cap layer 24, and exposure and development are performed by the exposure device, whereby a resist pattern (not illustrated) is formed so as to have opening portions in the respective regions in which the source electrode 42 and the drain electrode 43 are to be formed. After this, dry etching such as RIE is performed, the cap layer 24 in the region in which the resist pattern is not formed is removed, and a surface of the electron supply layer 23 is exposed. In the dry etching performed at this time, chlorine gas is used. After this, a metal film made of a laminated film Ta/Al (Ta: 20 nm, Al: 200 nm) is formed by vacuum vapor deposition or other such methods, and the resultant structure is immersed in an organic solvent or other such agents for a lift-off process, whereby the metal film formed on the resist pattern is removed together with the resist pattern. As a result, the source electrode 42 and the drain electrode 43 may be formed of Ta/Al on the electron supply layer 23 in the region in which the resist pattern is not formed. In addition, after the lift-off process, an ohmic contact may be achieved by, for example, performing heat treatment at a temperature of 550° C. Note that, in the above description, the resist pattern for the dry etching doubles as the resist pattern for the lift-off process, but may be formed separately from the resist pattern for the lift-off process. That is, in the above description, the step of forming the resist pattern is performed twice, but the resist pattern for forming the opening region in the insulating film 30 may double as the resist pattern for forming the source electrode 42 and the drain electrode 43. In this case, the step of forming the resist pattern may be performed only once.

Figure 9C:
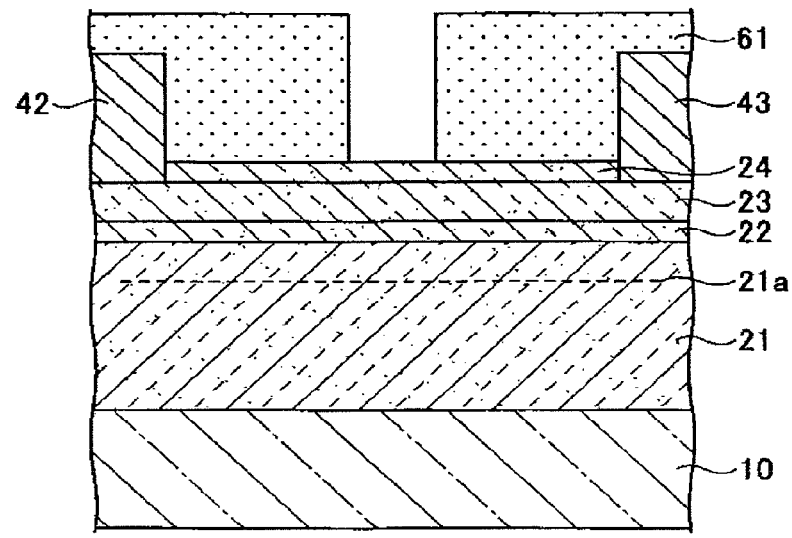

Next, as illustrated in FIG. 9C, the resist pattern 61 is formed on a surface of the cap layer 24. The resist pattern 61 is formed by applying photoresist to the surface of the cap layer 24 and performing exposure and development thereon by the exposure device. As a result, the resist pattern 61 is formed so as to have an opening portion in the region in which the gate recess 51 described later is to be formed.

Figure 10A:
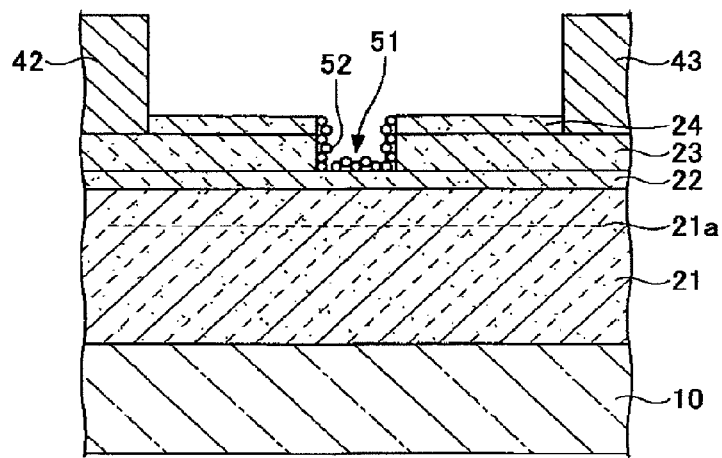
FIGS. 10A, 10B, and 10C are process views (2) each illustrating the method of producing a semiconductor device according to the second embodiment.
Figure 11:
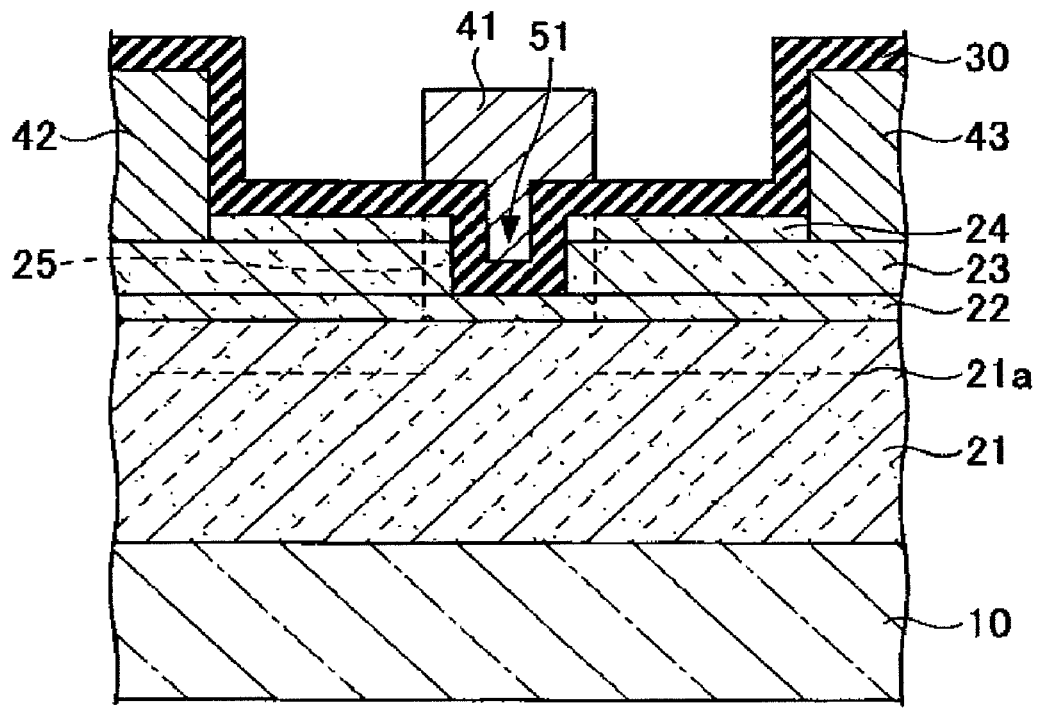
FIG. 11 is a process view (3) illustrating the method of producing a semiconductor device according to the second embodiment.

Next, as illustrated in FIG. 10A, dry etching such as RIE is performed, the cap layer 24 and the electron supply layer 23 in the region in which the resist pattern 61 is not formed are removed, and a surface of the spacer layer 22 is exposed, so that the gate recess 51 is formed. On this occasion, part of the spacer layer 22 may also be removed. The etching gas used for the dry etching such as RIE is fluorine gas (a gas containing fluorine components), and examples of the fluorine gas include $SF_6$, $CF_4$, $C_2F_6$, $C_3F_8$, $CHF_3$, $NF_3$, and $F_2$. In this way, the recess 51 is formed, and the fluorine components 52 contained in the fluorine gas used as the etching gas are attached to surfaces of the semiconductor layers corresponding to the side surfaces and the bottom surface of the formed recess 51. After this, the resist pattern 61 is removed using an organic solvent or other such agents.

Figure 10B:
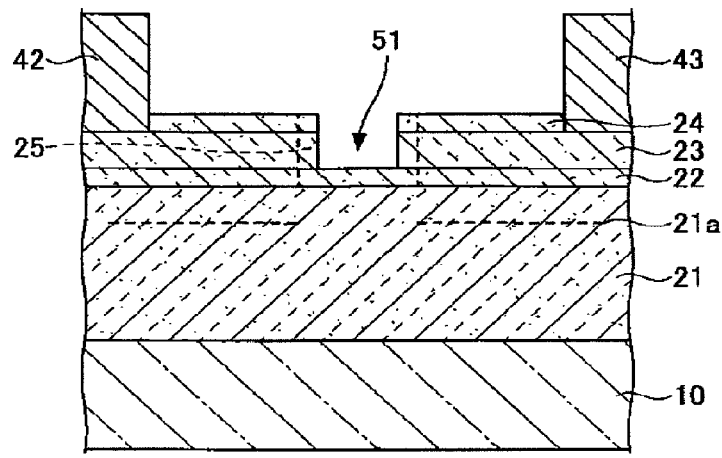

Next, as illustrated in FIG. 10B, heat treatment is performed in a nitrogen atmosphere. The heat treatment is performed for 1 to 20 minutes in the range of a temperature between 300° C. and 1,500° C. As a result, the fluorine contained in the fluorine components 52 attached to the surfaces of the semiconductor layers corresponding to the side surfaces and the bottom surface of the recess 51 may be implanted into the semiconductor layers, and the fluorine-containing region 25 is formed in the spacer layer 22 and other neighboring layers. Specifically, as illustrated in FIG. 5, the heat treatment is performed with the following changes in temperature: increase from room temperature to 400° C. in 30 seconds; keep at 400° C. for 30 seconds; increase from 400° C. to 700° C. in 30 seconds; and keep at 700° C. for 30 seconds. Then, the heating is stopped.

Figure 10C:
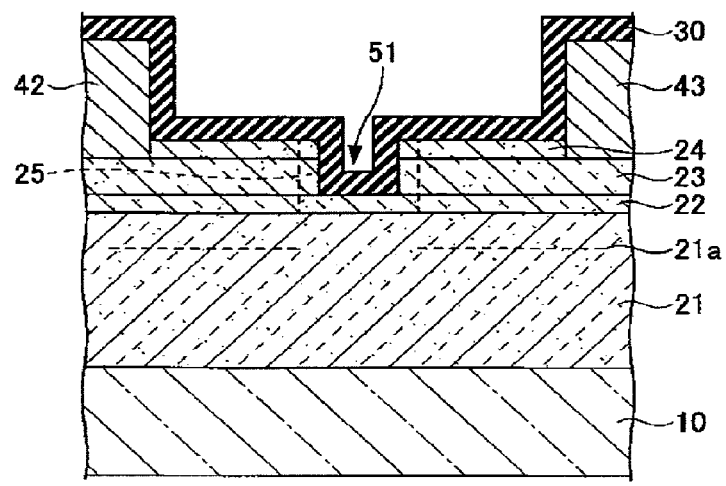

Next, as illustrated in FIG. 10C, the insulating film 30 as the gate insulating film is formed on the gate recess 51 and the cap layer 24. Specifically, the insulating film 30 is formed of an aluminum oxide ($Al_2O_3$) film with a thickness of 2 nm to 200 nm. In the present embodiment, the insulating film 30 is formed of an aluminum oxide film with a thickness of about 10 mm. Examples of the method of forming the insulating film 30 include CVD, ALD, and sputtering. Note that the insulating film 30 may be formed of an oxide, a nitride, or an oxynitride of Si, Al, Hf, Zr, Ti, Ta, and W instead of aluminum oxide described above.

Next, as illustrated in FIG. 11, the gate electrode 41 is formed on the insulating film 30 in the region in which the gate recess 51 is formed. Specifically, photoresist is applied to the insulating film 30, and exposure and development are performed by the exposure device, whereby a resist pattern (not illustrated) is formed so as to have an opening portion in the region in which the gate electrode 41 is to be formed. After this, a metal film Ni/Au (Ni: 10 nm, Au: 300 nm) is formed by vacuum vapor deposition, and the resultant structure is immersed in an organic solvent or other such agents for a lift-off process, whereby the metal film formed on the resist pattern is removed together with the resist pattern. As a result, the gate electrode 41 is formed of the metal film formed on the insulating film 30 in the region in which the resist pattern is not formed.

In this way, the semiconductor device according to the present embodiment may be produced. Note that contents other than the above are the same as those of the first embodiment.

<Third Embodiment>

Next, a third embodiment of the present invention is described. With reference to FIG. 12 to FIG. 14, a method of producing a semiconductor device according to the present embodiment is described.

Figure 12A:
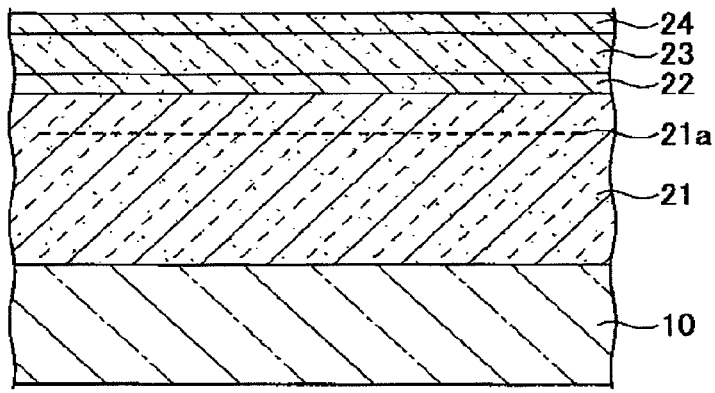
FIGS. 12A, 12B, and 12C are process views (1) each illustrating a method of producing a semiconductor device according to a third embodiment of the present invention.

First, as illustrated in FIG. 12A, the buffer layer (not illustrated) is formed on the substrate 10 made of semi-insulating SiC and other materials. Further, the electron transit layer 21, the spacer layer 22, the electron supply layer 23, and the cap layer 24 are sequentially formed as the semiconductor layers on the buffer layer. Note that the electron transit layer 21, the spacer layer 22, the electron supply layer 23, and the cap layer 24 as the semiconductor layers are formed by epitaxial growth using MOVPE. Specifically, the electron transit layer 21 as the first semiconductor layer is formed of i-GaN with a thickness of about 3 μm, and the spacer layer 22 as the third semiconductor layer is formed of i-GaN with a thickness of about 5 nm. The electron supply layer 23 as the second semiconductor layer is formed of n-AlGaN with a thickness of about 30 nm, and is doped with Si as an impurity element such that the impurity concentration thereof is $5 \times 10^{18}$ cm$^{-3}$. The cap layer 24 as the fourth semiconductor layer is formed of n-GaN with a thickness of about 10 nm, and is doped with Si as an impurity element such that the impurity concentration thereof is $5 \times 10^{18}$ cm$^{-3}$.

With this structure, the 2DEG 21a is formed in the portion of the electron transit layer 21 near the interface between the electron transit layer 21 and the spacer layer 22. After this, the element isolation region, the illustration of which is omitted, is formed.

Figure 12B:
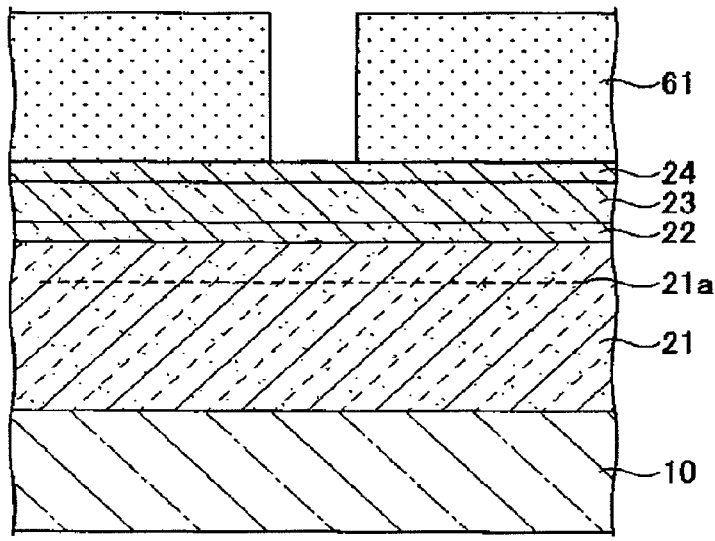

Next, as illustrated in FIG. 12B, the resist pattern 61 is formed on a surface of the cap layer 24. The resist pattern 61 is formed by applying photoresist to the surface of the cap layer 24 and performing exposure and development thereon by the exposure device. As a result, the resist pattern 61 is formed so as to have an opening portion in the region in which the gate recess 51 described later is to be formed.

Figure 12C:
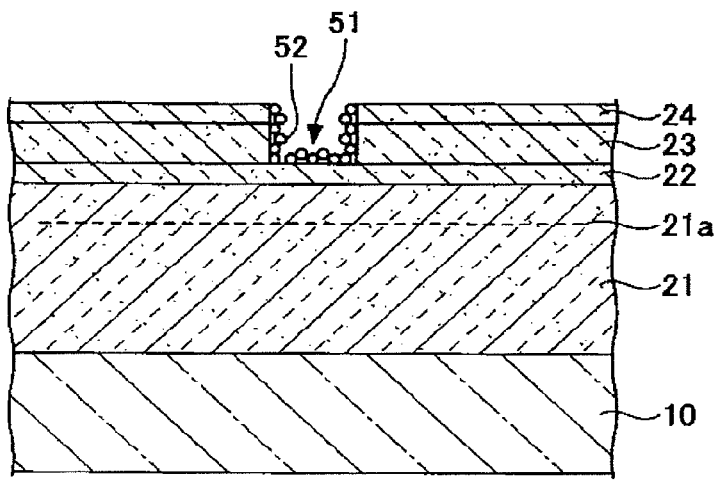

Next, as illustrated in FIG. 12C, dry etching such as RIE is performed, entire portions of the cap layer 24 and the electron supply layer 23 in the region in which the resist pattern 61 is not formed are removed, and a surface of the spacer layer 22 is exposed, so that the gate recess 51 is formed. On this occasion, part of the spacer layer 22 may also be removed. The etching gas used for the dry etching such as RIE is fluorine gas, and examples of the fluorine gas include $SF_6$, $CF_4$, $C_2F_6$, $C_3F_8$, $CHF_3$, $NF_3$, and $F_2$. In this way, the recess 51 is formed, and the fluorine components 52 contained in the fluorine gas used as the etching gas are attached to surfaces of the semiconductor layers corresponding to the side surfaces and the bottom surface of the formed recess 51. After this, the resist pattern 61 is removed using an organic solvent or other such agents.

Figure 13A:
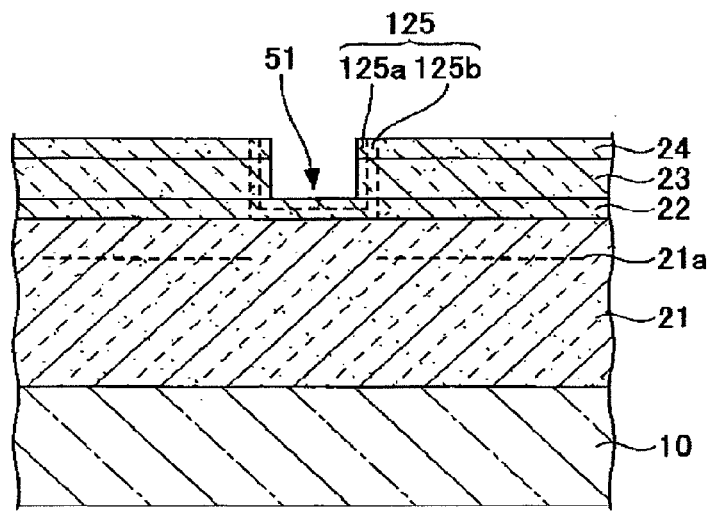
FIGS. 13A, 13B, and 13C are process views (2) each illustrating the method of producing a semiconductor device according to the third embodiment.
Figure 14:
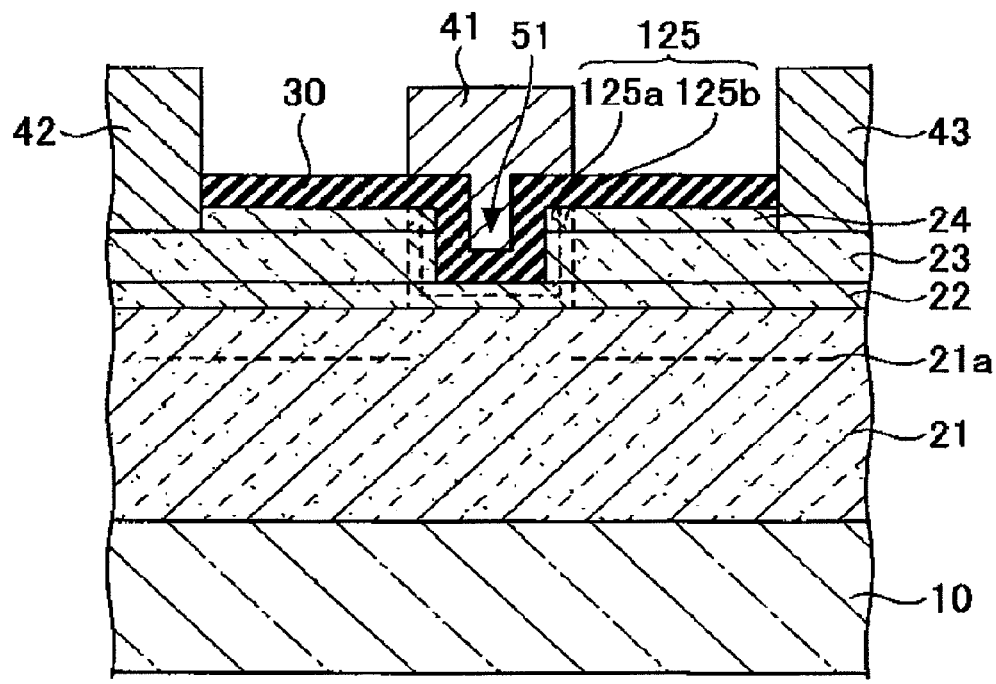
FIG. 14 is a process view (3) illustrating the method of producing a semiconductor device according to the third embodiment.
Figure 15:
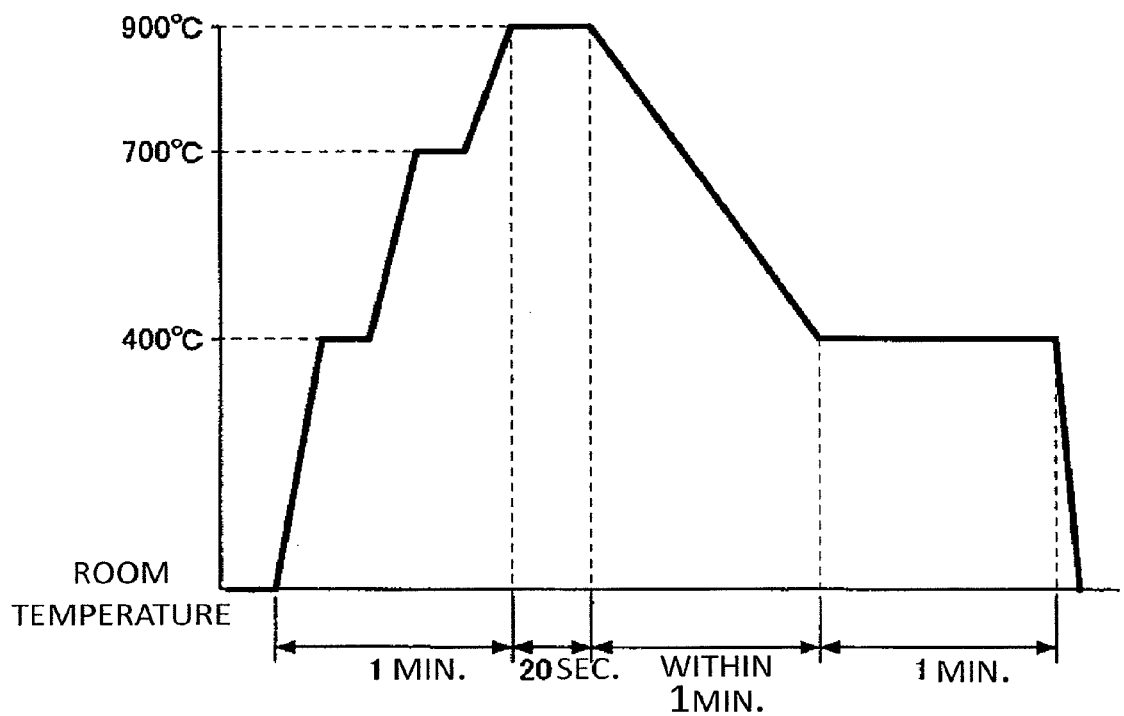
FIG. 15 is an explanatory graph illustrating heat treatment in the method of producing a semiconductor device according to the third embodiment.

Next, as illustrated in FIG. 13A, heat treatment is performed in a nitrogen atmosphere. As illustrated in FIG. 15, the heat treatment is performed with the following changes in temperature: increase from room temperature to 400° C.; keep at 400° C. for a predetermined time; increase from 400° C. to 700° C.; keep at 700° C. for a predetermined time; increase from 700° C. to 900° C.; and keep at 900° C. for 20 seconds. Note that the time to reach 900° C. from the heating start is about 1 minute. After this, the temperature is lowered to 400° C. within about 1 minute and is kept at 400° C. for 1 minute. Then, the heating is stopped. Note that, in the present embodiment, the period until the heating at 900° C. is ended from the heating start is referred to as a first heat treatment, and the period until the heating at 400° C. is ended after the end of the heating at 900° C. is referred to as a second heat treatment. As a result of the heat treatment, a first fluorine-containing region 125a having a high fluorine concentration is formed in the semiconductor layers around the recess 51, and a second fluorine-containing region 125b having a fluorine concentration lower than that of the first fluorine-containing region 125a is formed around the first fluorine-containing region 125a. In the present embodiment, the fluorine-containing region 125 is formed of the first fluorine-containing region 125a and the second fluorine-containing region 125b. That is, the first fluorine-containing region 125a is formed in the first heat treatment from the heating start to the end of the heating at 900° C. Because the heat treatment is performed at a high temperature in a short time, fluorine quickly enters flaws or other such defects in the semiconductor layers near the recess 51, so that the first fluorine-containing region 125a having a high fluorine concentration may be formed. After this, in the second heat treatment, the temperature is lowered to 400° C., and the heating at 400° C. is performed, so that the second fluorine-containing region 125b having a low fluorine concentration may be formed. Once entered, fluorine remains held in the flaws or other such defects in the semiconductor layers. Hence, the fluorine that has entered the semiconductor layers near the recess 51 in the first heat treatment remains held therein even during the second heat treatment. In the second heat treatment, the fluorine that has not entered the flaws in the semiconductor layers in the first heat treatment enters the semiconductor layers around the first fluorine-containing region 125a, so that the second fluorine-containing region 125b having a fluorine concentration lower than that of the first fluorine-containing region 125a is formed. Note that the fluorine that has once been heated to be taken into the semiconductor layers may be diffused inside of the semiconductor layers even at a temperature lower than 500° C. Accordingly, even in the second heat treatment performed at a temperature lower than 500° C., the second fluorine-containing region 125b may be formed.

Figure 13B:
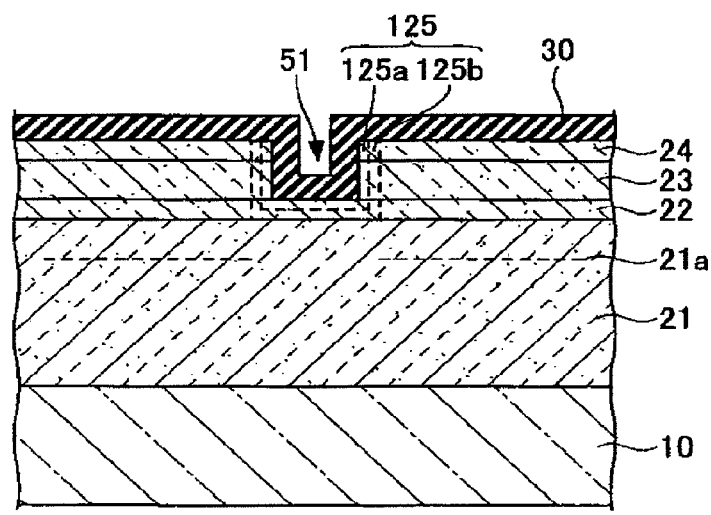

Next, as illustrated in FIG. 13B, the insulating film 30 as the gate insulating film is formed on the gate recess 51 and the cap layer 24. In the present embodiment, the insulating film 30 is formed of an aluminum oxide ($Al_2O_3$) film with a thickness of 2 nm to 200 nm. More specifically, the insulating film 30 is formed of an aluminum oxide film with a thickness of about 10 mm. Examples of the method of forming the insulating film 30 include CVD, ALD, and sputtering. Note that the insulating film 30 may be formed of an oxide, a nitride, or an oxynitride of Si, Al, Hf, Zr, Ti, Ta, and W instead of aluminum oxide described above.

Figure 13C:
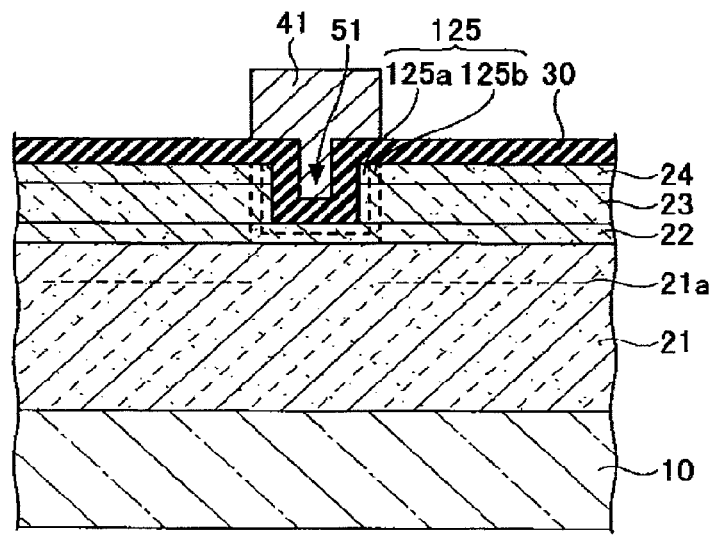

Next, as illustrated in FIG. 13C, the gate electrode 41 is formed on the insulating film 30 in the region in which the gate recess 51 is formed. Specifically, photoresist is applied to the insulating film 30, and exposure and development are performed by the exposure device, whereby a resist pattern (not illustrated) is formed so as to have an opening portion in the region in which the gate electrode 41 is to be formed. After this, a metal film Ni/Au (Ni: 10 nm, Au: 300 nm) is formed by vacuum vapor deposition, and the resultant structure is immersed in an organic solvent or other such agents for a lift-off process, whereby the metal film formed on the resist pattern is removed together with the resist pattern. As a result, the gate electrode 41 is formed of the metal film formed on the insulating film 30 in the region in which the resist pattern is not formed.

Next, as illustrated in FIG. 14, the source electrode 42 and the drain electrode 43 are formed. Specifically, photoresist is applied to the insulating film 30, and exposure and development are performed by the exposure device, whereby a resist pattern (not illustrated) is formed so as to have opening portions in the respective regions in which the source electrode 42 and the drain electrode 43 are to be formed. After this, dry etching such as RIE is performed, the insulating film 30 and the cap layer 24 in the region in which the resist pattern is not formed are removed, and a surface of the electron supply layer 23 is exposed. In the dry etching performed at this time, fluorine gas is used for removing the insulating film 30, and chlorine gas is used for removing the cap layer 24. After this, a metal film made of a laminated film Ta/Al (Ta: 20 nm, Al: 200 nm) is formed by vacuum vapor deposition or other such methods, and the resultant structure is immersed in an organic solvent or other such agents for a lift-off process, whereby the metal film formed on the resist pattern is removed together with the resist pattern. As a result, the source electrode 42 and the drain electrode 43 may be formed of Ta/Al on the electron supply layer 23 in the region in which the resist pattern is not formed. In addition, after the lift-off process, an ohmic contact may be achieved by, for example, performing heat treatment at a temperature of 550° C.

In this way, the semiconductor device may be produced using the method of producing a semiconductor device according to the present embodiment.

Figure 16:
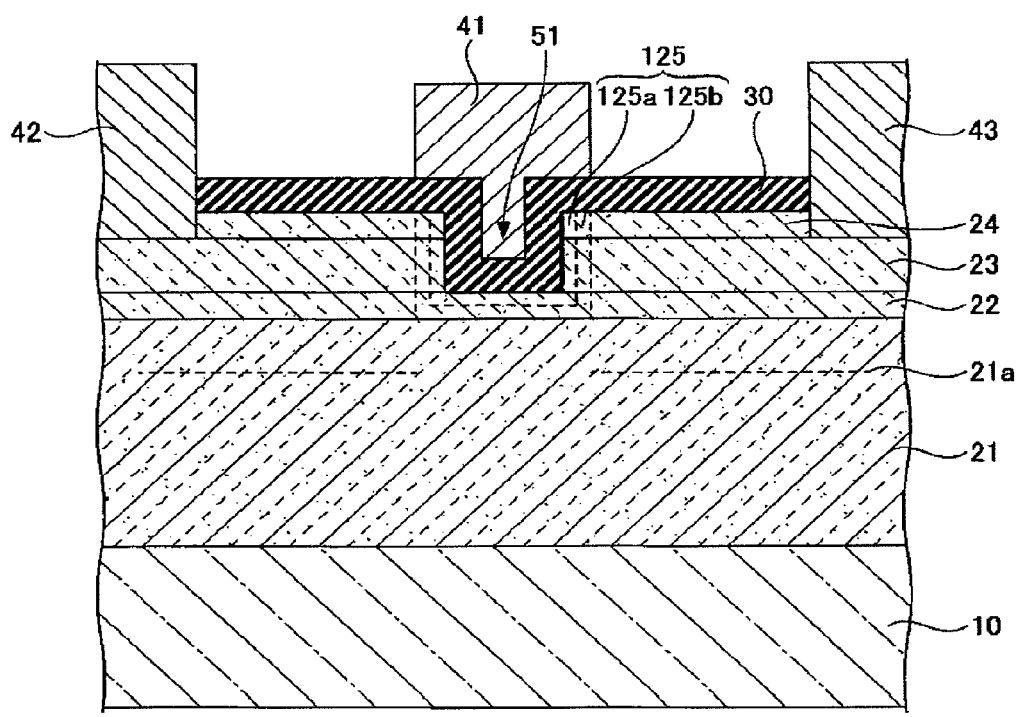
FIG. 16 is a structural view illustrating a semiconductor device according to the third embodiment.
Figure 17:
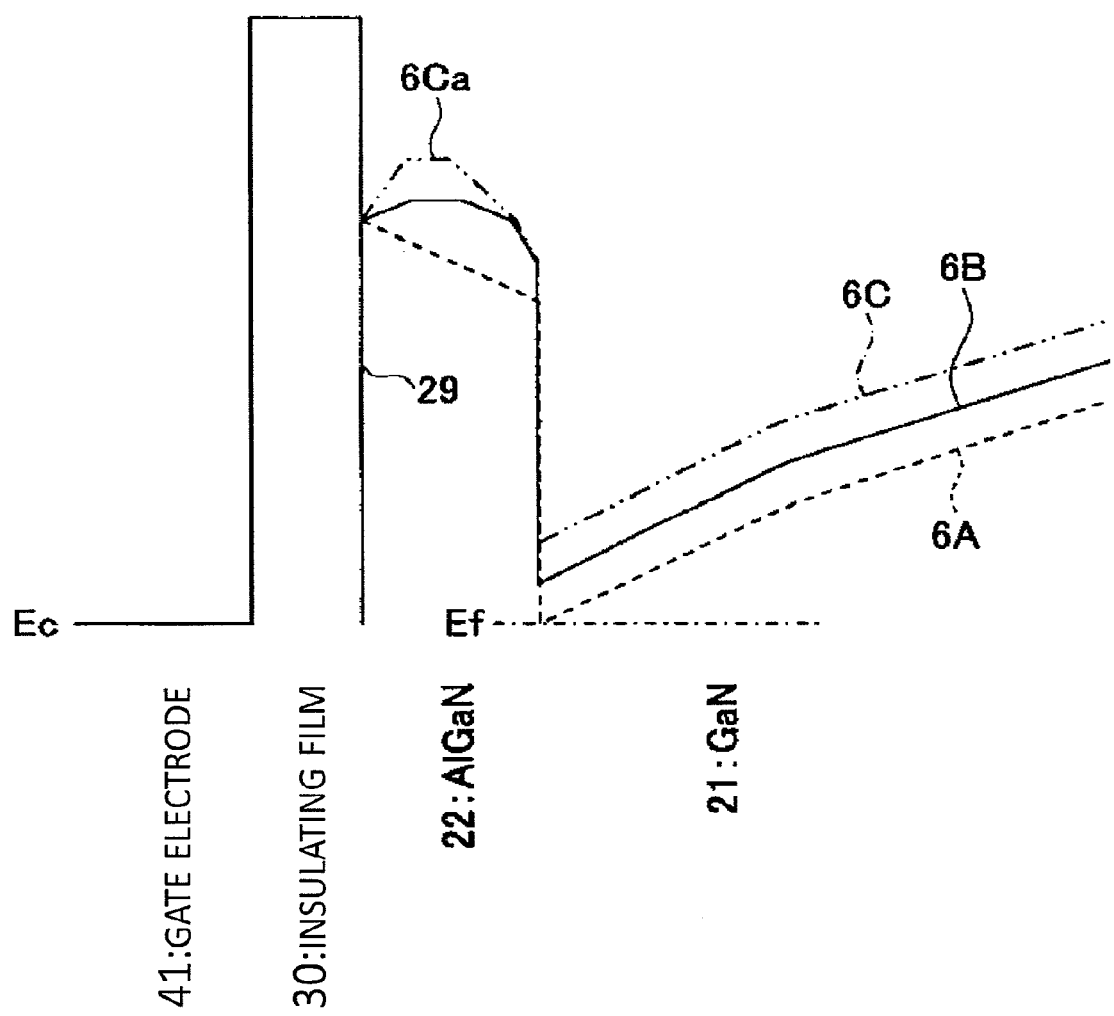
FIG. 17 is an explanatory view illustrating the semiconductor device according to the third embodiment.

FIG. 16 illustrates the structure of a semiconductor device according to the present embodiment, and FIG. 17 illustrates the state of a conduction band of the region in which the recess 51 is formed. 6C in FIG. 17 indicates the state of the semiconductor device according to the present embodiment in which fluorine is implanted. As indicated by 6C, in the semiconductor device according to the present embodiment, the conduction band of the electron transit layer 21 and the spacer layer 22 may be brought further higher, leading to a further more reliable normally-off operation. In addition, a mountain portion 6Ca formed in the spacer layer 22 may be higher. Hence, the number of electrons trapped at the interface 29 between the insulating film 30 and the spacer layer 22 may be further smaller, so that fluctuations in the threshold value of the gate voltage may be further reduced. Note that contents other than the above are the same as those of the first embodiment, and the present embodiment may be similarly applied to the second embodiment.

<Fourth Embodiment>

Next, a fourth embodiment of the present invention is described. With reference to FIG. 18 to FIG. 20, a method of producing a semiconductor device according to the present embodiment is described.

Figure 18A:
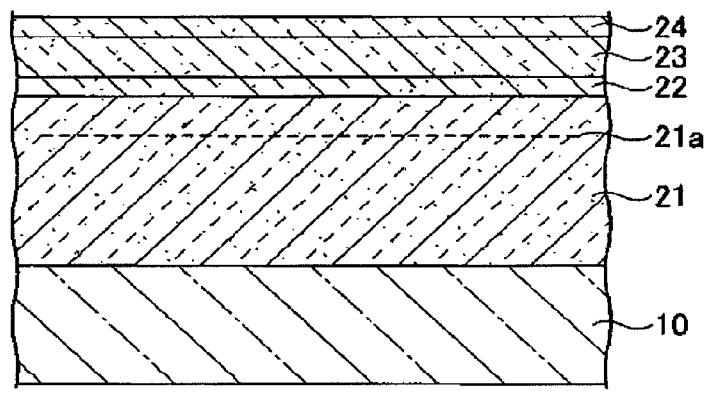
FIGS. 18A, 18B, and 18C are process views (1) each illustrating a method of producing a semiconductor device according to a fourth embodiment of the present invention.

First, as illustrated in FIG. 18A, the buffer layer (not illustrated) is formed on the substrate 10 made of semi-insulating SiC and other materials. Further, the electron transit layer 21, the spacer layer 22, the electron supply layer 23, and the cap layer 24 are sequentially formed as the semiconductor layers on the buffer layer. Note that the electron transit layer 21, the spacer layer 22, the electron supply layer 23, and the cap layer 24 as the semiconductor layers are formed by epitaxial growth using MOVPE. Specifically, the electron transit layer 21 as the first semiconductor layer is formed of i-GaN with a thickness of about 3 μm, and the spacer layer 22 as the third semiconductor layer is formed of i-GaN with a thickness of about 5 nm. The electron supply layer 23 as the second semiconductor layer is formed of n-AlGaN with a thickness of about 30 nm, and is doped with Si as an impurity element such that the impurity concentration thereof is $5\times10^{18}$ $cm^{-3}$. The cap layer 24 as the fourth semiconductor layer is formed of n-GaN with a thickness of about 10 nm, and is doped with Si as an impurity element such that the impurity concentration thereof is $5\times10^{18}$ $cm^{-3}$. With this structure, the 2DEG 21a is formed in the portion of the electron transit layer 21 near the interface between the electron transit layer 21 and the spacer layer 22. After this, the element isolation region, the illustration of which is omitted, is formed.

Figure 18B:
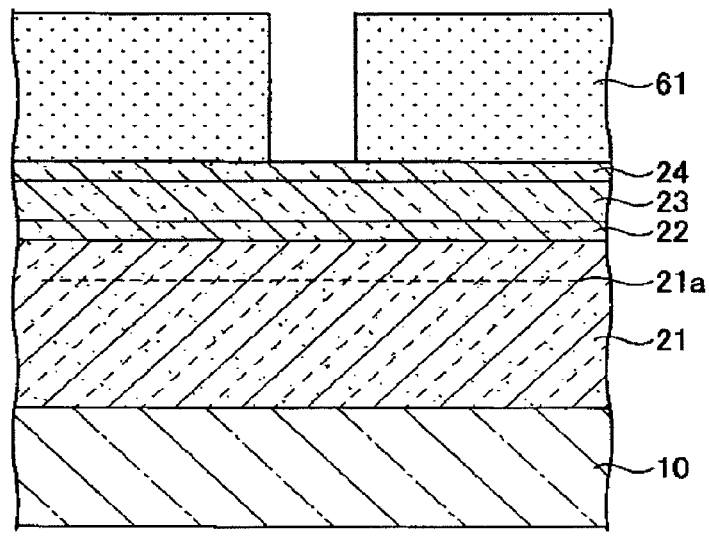

Next, as illustrated in FIG. 18B, the resist pattern 61 is formed on a surface of the cap layer 24. The resist pattern 61 is formed by applying photoresist to the surface of the cap layer 24 and performing exposure and development thereon by the exposure device. As a result, the resist pattern 61 is formed so as to have an opening portion in the region in which the gate recess 51 described later is to be formed.

Figure 18C:
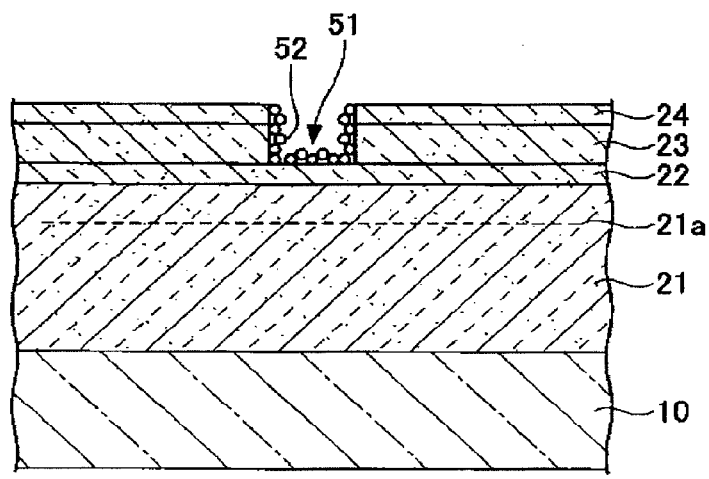

Next, as illustrated in FIG. 18C, dry etching such as RIE is performed, entire portions of the cap layer 24 and the electron supply layer 23 in the region in which the resist pattern 61 is not formed are removed, and a surface of the spacer layer 22 is exposed, so that the gate recess 51 is formed. On this occasion, part of the spacer layer 22 may also be removed. The etching gas used for the dry etching such as RIE is fluorine gas, and examples of the fluorine gas include $SF_6$, $CF_4$, $C_2F_6$, $C_3F_8$, $CHF_3$, $NF_3$, and $F_2$. In this way, the recess 51 is formed, and the fluorine components 52 contained in the fluorine gas used as the etching gas are attached to surfaces of the semiconductor layers corresponding to the side surfaces and the bottom surface of the formed recess 51. After this, the resist pattern 61 is removed using an organic solvent or other such agents.

Figure 19A:
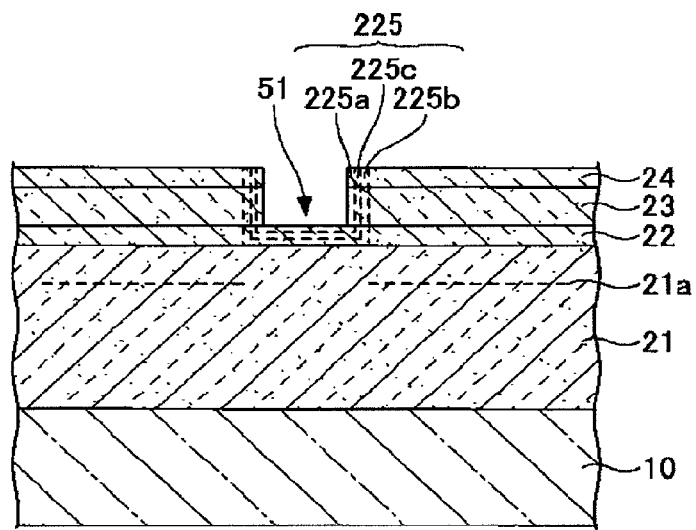
FIGS. 19A, 19B, and 19C are process views (2) each illustrating the method of producing a semiconductor device according to the fourth embodiment.
Figure 20:
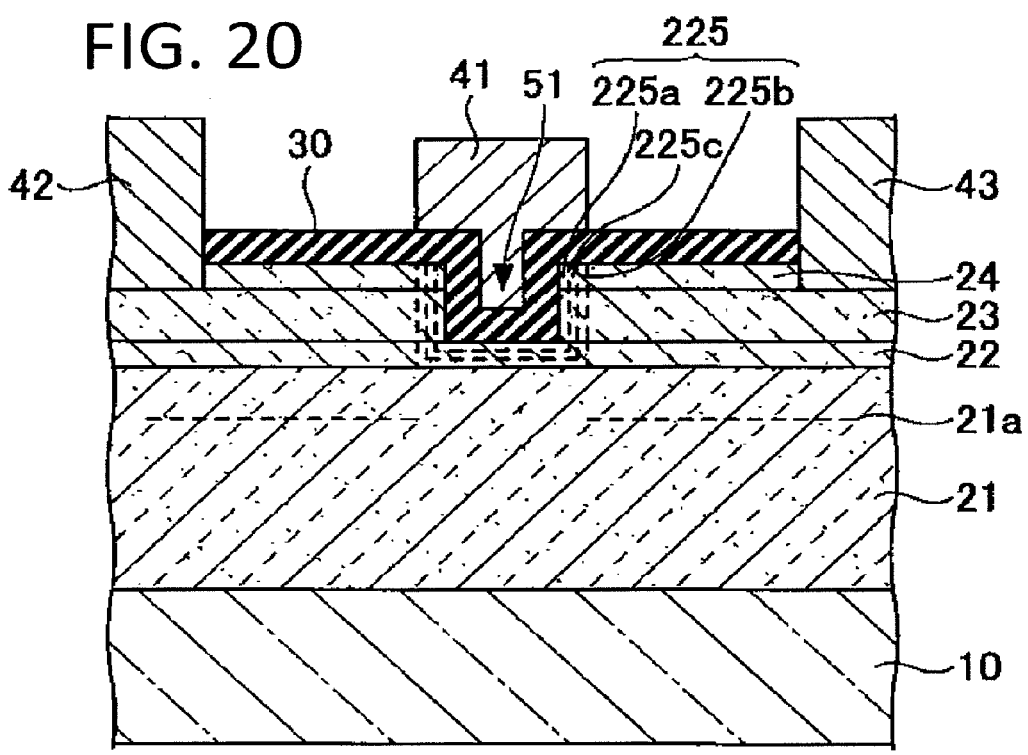
FIG. 20 is a process view (3) illustrating the method of producing a semiconductor device according to the fourth embodiment.
Figure 21:
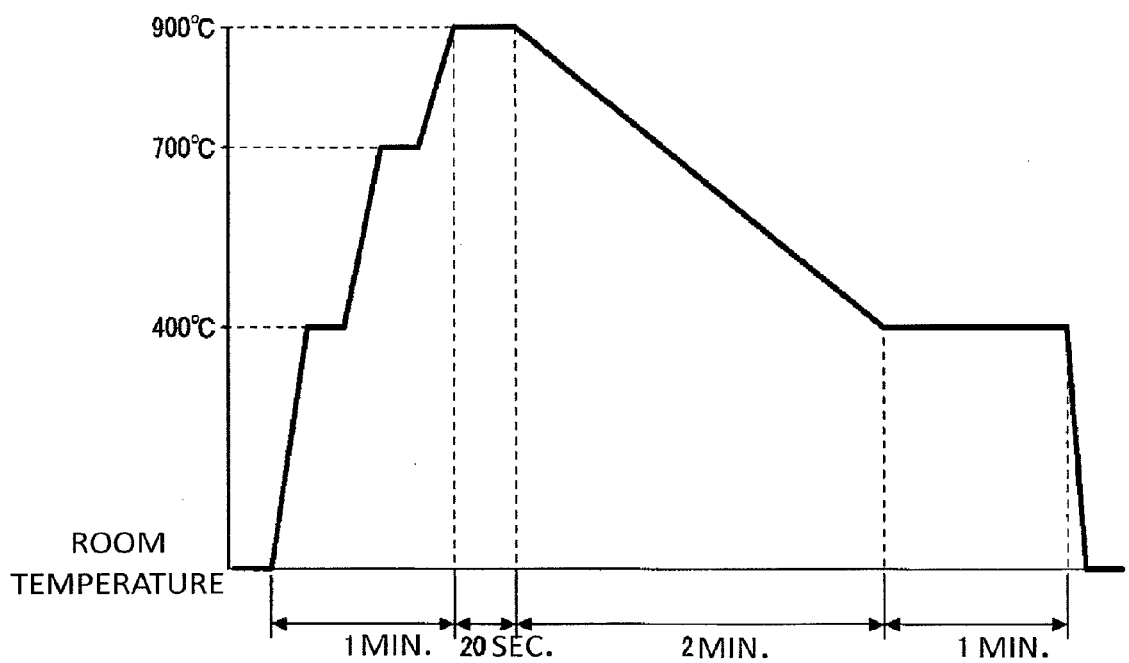
FIG. 21 is an explanatory graph illustrating heat treatment in the method of producing a semiconductor device according to the fourth embodiment.

Next, as illustrated in FIG. 19A, heat treatment is performed in a nitrogen atmosphere. As illustrated in FIG. 21, the heat treatment is performed with the following changes in temperature: increase from room temperature to 400° C.; keep at 400° C. for a predetermined time; increase from 400° C. to 700° C.; keep at 700° C. for a predetermined time; increase from 700° C. to 900° C.; and keep at 900° C. for 20 seconds. Note that the time to reach 900° C. from the heating start is about 1 minute. After this, the temperature is lowered to 400° C. in about 2 minutes and is kept at 400° C. for 1 minute. Then, the heating is stopped. Note that, in the present embodiment, the period until the heating at 900° C. is ended from the heating start is referred to as a first heat treatment, the period until the temperature is gradually lowered to reach 400° C. after the end of the heating at 900° C. is referred to as a third heat treatment, and the period until the heating at 400° C. is ended from the start of the heating at 400° C. is referred to as a second heat treatment. As a result of the heat treatment, a first fluorine-containing region 225a is formed in the semiconductor layers around the recess 51, a third fluorine-containing region 225c is formed around the first fluorine-containing region 225a, and a second fluorine-containing region 225b is formed around the third fluorine-containing region 225c. The first fluorine-containing region 225a has a high fluorine concentration, and the second fluorine-containing region 225b has a fluorine concentration lower than that of the first fluorine-containing region 225a. The third fluorine-containing region 225c has a fluorine concentration that gradually changes from the fluorine concentration of the first fluorine-containing region 225a to the fluorine concentration of the second fluorine-containing region 225b.

That is, the first fluorine-containing region 225a is formed in the first heat treatment from the heating start to the end of the heating at 900° C. Because the heat treatment is performed at a high temperature in a short time, fluorine quickly enters flaws or other such defects in the semiconductor layers near the recess 51, so that the first fluorine-containing region 225a having a high fluorine concentration may be formed. After this, in the third heat treatment, the heating is performed with the temperature being gradually lowered to reach 400° C., so that the third fluorine-containing region 225c having the gradually changing fluorine concentration may be formed. After this, in the second heat treatment, the heating at 400° C. is performed, so that the second fluorine-containing region 225b having a low fluorine concentration may be formed. In this way, because the temperature is gradually lowered from 900° C. to 400° C. in the third heat treatment, the third fluorine-containing region 225c having the gradually changing fluorine concentration may be formed between the first fluorine-containing region 225a and the second fluorine-containing region 225b.

Figure 19B:
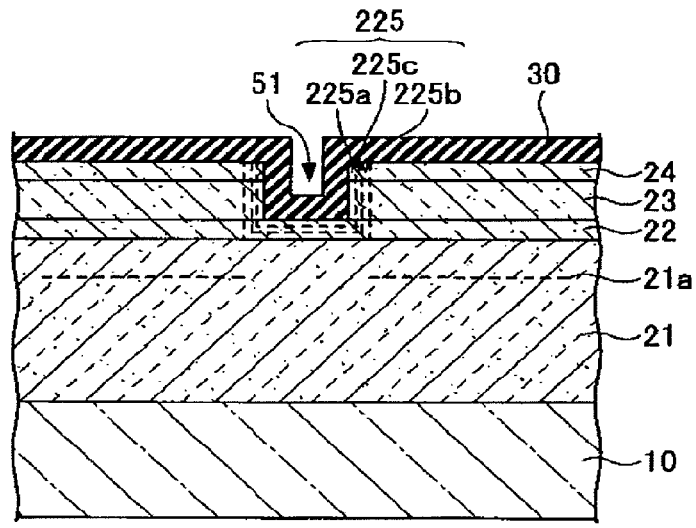

Next, as illustrated in FIG. 19B, the insulating film 30 as the gate insulating film is formed on the gate recess 51 and the cap layer 24. Specifically, the insulating film 30 is formed of an aluminum oxide ($Al_2O_3$) film with a thickness of 2 nm to 200 nm. In the present embodiment, the insulating film 30 is formed of an aluminum oxide film with a thickness of about 10 mm. Examples of the method of forming the insulating film 30 include CVD, ALD, and sputtering. Note that the insulating film 30 may be formed of an oxide, a nitride, or an oxynitride of Si, Al, Hf, Zr, Ti, Ta, and W instead of aluminum oxide described above.

Figure 19C:
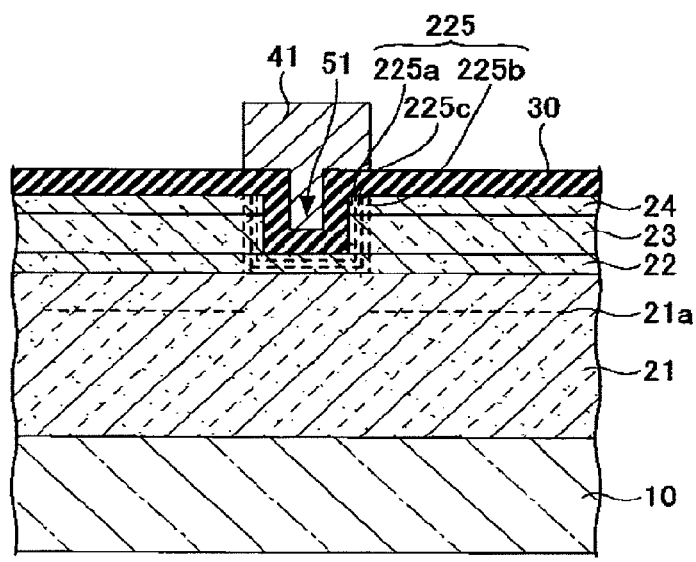

Next, as illustrated in FIG. 19C, the gate electrode 41 is formed on the insulating film 30 in the region in which the gate recess 51 is formed. Specifically, photoresist is applied to the insulating film 30, and exposure and development are performed by the exposure device, whereby a resist pattern (not illustrated) is formed so as to have an opening portion in the region in which the gate electrode 41 is to be formed. After this, a metal film Ni/Au (Ni: 10 nm, Au: 300 nm) is formed by vacuum vapor deposition, and the resultant structure is immersed in an organic solvent or other such agents for a lift-off process, whereby the metal film formed on the resist pattern is removed together with the resist pattern. As a result, the gate electrode 41 is formed of the metal film formed on the insulating film 30 in the region in which the resist pattern is not formed.

Next, as illustrated in FIG. 20, the source electrode 42 and the drain electrode 43 are formed. Specifically, photoresist is applied to the insulating film 30, and exposure and development are performed by the exposure device, whereby a resist pattern (not illustrated) is formed so as to have opening portions in the respective regions in which the source electrode 42 and the drain electrode 43 are to be formed. After this, dry etching such as RIE is performed, the insulating film 30 and the cap layer 24 in the region in which the resist pattern is not formed are removed, and a surface of the electron supply layer 23 is exposed. In the dry etching performed at this time, fluorine gas is used for removing the insulating film 30, and chlorine gas is used for removing the cap layer 24. After this, a metal film made of a laminated film Ta/Al (Ta: 20 nm, Al: 200 nm) is formed by vacuum vapor deposition or other such methods, and the resultant structure is immersed in an organic solvent or other such agents for a lift-off process, whereby the metal film formed on the resist pattern is removed together with the resist pattern. As a result, the source electrode 42 and the drain electrode 43 may be formed of Ta/Al on the electron supply layer 23 in the region in which the resist pattern is not formed. In addition, after the lift-off process, an ohmic contact may be achieved by, for example, performing heat treatment at a temperature of 550° C.

In this way, the semiconductor device may be produced using the method of producing a semiconductor device according to the present embodiment.

Figure 22:
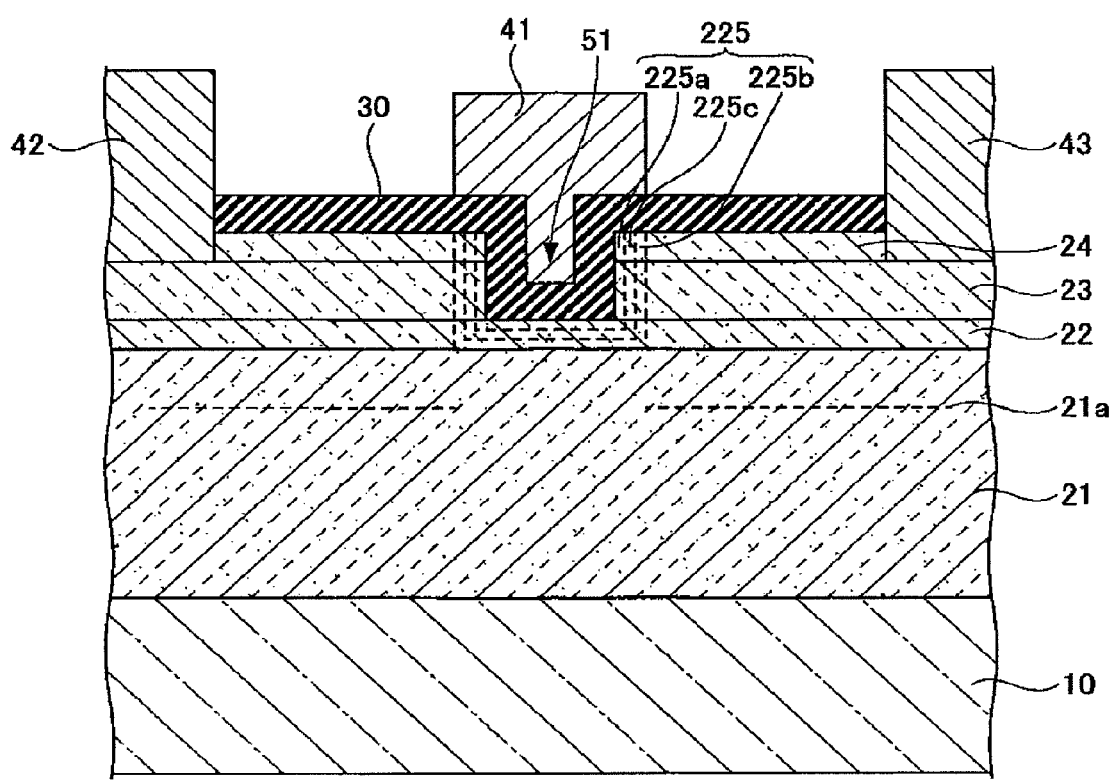
FIG. 22 is a structural view illustrating a semiconductor device according to the fourth embodiment.
Figure 23:
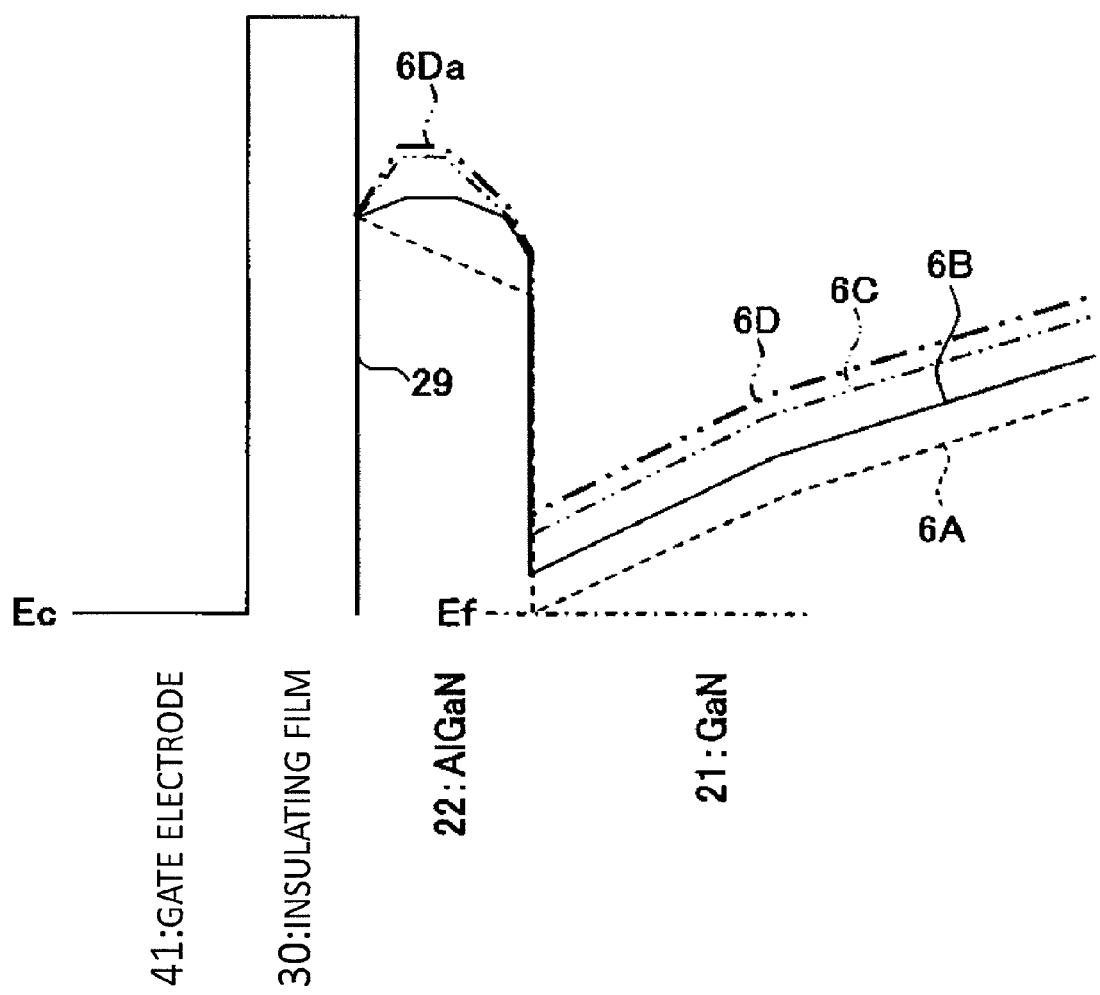
FIG. 23 is an explanatory view illustrating the semiconductor device according to the fourth embodiment.

FIG. 22 illustrates the structure of a semiconductor device according to the present embodiment, and FIG. 23 illustrates the state of a conduction band of the region in which the recess 51 is formed. 6D in FIG. 23 indicates the state of the semiconductor device according to the present embodiment in which fluorine is implanted. As illustrated in FIG. 22, in the semiconductor device according to the present embodiment, the third fluorine-containing region 225c having the gradually changing fluorine concentration is formed between the first fluorine-containing region 225a and the second fluorine-containing region 225b. As a result, as indicated by 6D, the conduction band of the electron transit layer 21 and the spacer layer 22 may be brought further higher, leading to a further more reliable normally-off operation. In addition, a mountain portion 6Da formed in the spacer layer 22 may be higher. Hence, the number of electrons trapped at the interface 29 between the insulating film 30 and the spacer layer 22 may be further smaller, so that fluctuations in the threshold value of the gate voltage may be further reduced. Note that contents other than the above are the same as those of the first embodiment and the third embodiment, and the present embodiment may be similarly applied to the second embodiment.

<Fifth Embodiment>

Next, a fifth embodiment of the present invention is described. The present embodiment relates to a semiconductor package, a power-supply device, and a high-frequency amplifier.

Figure 24:
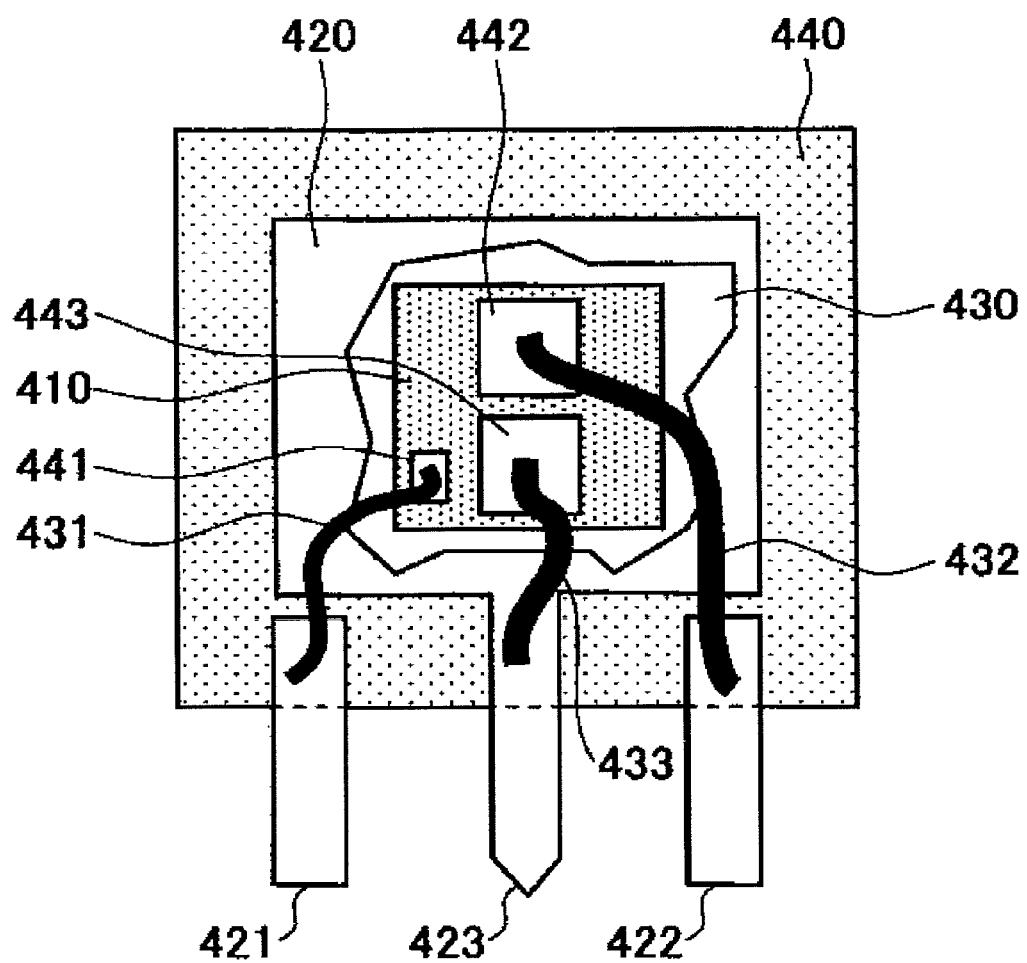
FIG. 24 is an explanatory view illustrating a discrete semiconductor package according to a fifth embodiment of the present invention.

The semiconductor package according to the present embodiment is produced by discretely packaging the semiconductor device according to any of the first to fourth embodiments. With reference to FIG. 24, such a discrete semiconductor package thus produced is described. Note that FIG. 24 schematically illustrates the inside of the discrete semiconductor package, and the arrangement and other such configurations of electrodes are illustrated differently from those in the first to fourth embodiments.

First, the semiconductor device produced according to any of the first to fourth embodiments is diced into semiconductor chips 410 each including a HEMT made of a GaN-based semiconductor material. The semiconductor chip 410 is fixed onto a lead frame 420 by a die-attaching material 430 such as solders.

Next, a gate electrode 441 is connected to a gate lead 421 by a bonding wire 431, a source electrode 442 is connected to a source lead 422 by a bonding wire 432, and a drain electrode 443 is connected to a drain lead 423 by a bonding wire 433. The bonding wires 431, 432, and 433 are each formed of a metal material such as Al. The gate electrode 441 according to the present embodiment is a gate electrode pad and is connected to the gate electrode 41 according to any of the first to fourth embodiments. Similarly, the source electrode 442 is a source electrode pad and is connected to the source electrode 42, and the drain electrode 443 is a drain electrode pad and is connected to the drain electrode 43.

Next, the structure is sealed with a molding resin 440 by transfer molding. In this way, the discrete semiconductor package including the HEMT made of a GaN-based semiconductor material may be produced.

In addition, the power-supply device and the high-frequency amplifier according to the present embodiment each include the semiconductor device according to any of the first to fourth embodiments.

Figure 25:
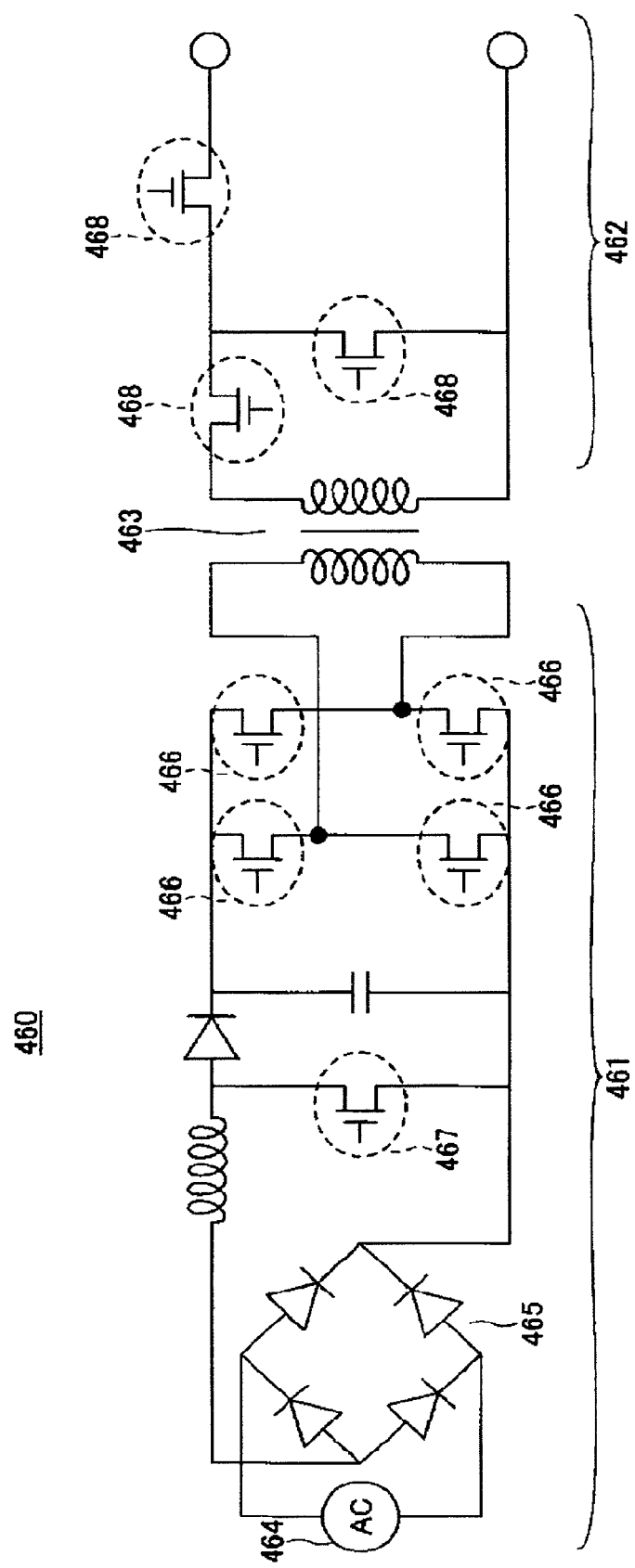
FIG. 25 is a circuit diagram illustrating a power-supply device according to the fifth embodiment.

With reference to FIG. 25, a power-supply device 460 according to the present embodiment is described. The power-supply device 460 according to the present embodiment includes a high-voltage primary circuit 461, a low-voltage secondary circuit 462, and a transformer 463 disposed between the primary circuit 461 and the secondary circuit 462. The primary circuit 461 includes an alternating-current source 464, a so-called bridge rectifier circuit 465, a plurality of (in the example illustrated in FIG. 25, four) switching elements 466, and a switching element 467. The secondary circuit 462 includes a plurality of (in the example illustrated in FIG. 25, three) switching elements 468. In the example illustrated in FIG. 25, the semiconductor device according to any of the first to fourth embodiments is used for each of the switching elements 466 and 467 of the primary circuit 461. It is preferable that the switching elements 466 and 467 of the primary circuit 461 be normally-off semiconductor devices. Meanwhile, a normal metal insulator semiconductor field effect transistor (MISFET) formed of silicon is used for the switching elements 468 of the secondary circuit 462.

Figure 26:
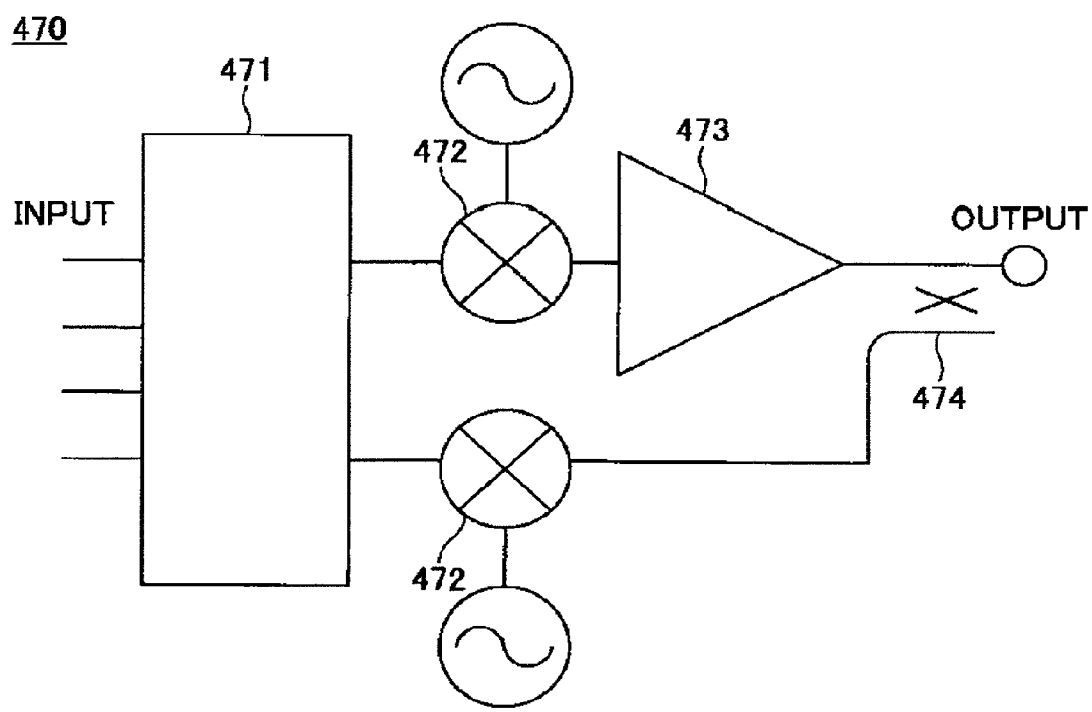
FIG. 26 is a structural view illustrating a high-power amplifier according to the fifth embodiment.

With reference to FIG. 26, a high-frequency amplifier 470 according to the present embodiment is described. The high-frequency amplifier 470 according to the present embodiment may be applied to, for example, a power amplifier for a base station of mobile phones. The high-frequency amplifier 470 includes a digital predistortion circuit 471, mixers 472, a power amplifier 473, and a directional coupler 474. The digital predistortion circuit 471 compensates nonlinear distortion of an input signal. The mixer 472 mixes the input signal whose nonlinear distortion has been compensated, with an alternating-current signal. The power amplifier 473 amplifies the input signal mixed with the alternating-current signal. In the example illustrated in FIG. 26, the power amplifier 473 includes the semiconductor device according to any of the first to fourth embodiments. The directional coupler 474 monitors input signals and output signals. In the circuit illustrated in FIG. 26, for example, changing over a switch may cause the mixer 472 to mix an output signal with an alternating-current signal and send out the resultant signal to the digital predistortion circuit 471.

Hereinabove, the embodiments have been described in detail, but the present invention is not limited to particular embodiments, and thus may be variously modified and changed within the scope of the claims.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiments of the present invention have been described in detail, it should be understood that the various changes, substitutions, and alterations could be made hereto without departing from the spirit and scope of the invention.

What is claimed is:

1. A method of producing a semiconductor device, comprising:
   forming a semiconductor layer on a substrate;
   forming a recess in the semiconductor layer by dry etching with a gas containing fluorine components, the recess having an opening portion on the surface of the semiconductor layer;
   forming a fluorine-containing region by heating the semiconductor layer and thus diffusing, into the semiconductor layer, the fluorine components attached to side surfaces and a bottom surface of the recess;
   forming an insulating film on an inner surface of the recess and on the semiconductor layer; and
   forming an electrode on the insulating film in a region in which the recess is formed.

2. The method of producing a semiconductor device according to claim 1, wherein
   the semiconductor layer contains a nitride semiconductor.

3. The method of producing a semiconductor device according to claim 1,
   wherein the forming the recess comprises:
   forming a resist pattern on the semiconductor layer so as to have an opening in the region in which the recess is formed; and removing a portion of the semiconductor layer by dry etching, the portion corresponding to the opening of the resist pattern.

4. The method of producing a semiconductor device according to claim 3, wherein
the forming the recess further comprises: removing the resist pattern, after the removing a portion of the semiconductor layer.

5. The method of producing a semiconductor device according to claim 1, wherein the dry etching includes reactive ion etching (RIE).

6. The method of producing a semiconductor device according to claim 1, wherein
the forming a fluorine-containing region is performed by heating the semiconductor layer to a temperature equal to or higher than 300° C.

7. The method of producing a semiconductor device according to claim 1, wherein
the forming a fluorine-containing region comprises a first heat treatment and a second heat treatment,
the first heat treatment includes heating the semiconductor layer at a temperature equal to or higher than 500° C., and
the second heat treatment includes heating the semiconductor layer at a temperature lower than 500° C.

8. The method of producing a semiconductor device according to claim 7, wherein
the forming a fluorine-containing region further comprises a third heat treatment between the first heat treatment and the second heat treatment, and
the third heat treatment includes heating while lowering temperature in a predetermined time from the temperature in the first heat treatment to the temperature in the second heat treatment.

9. The method of producing a semiconductor device according to claim 1, wherein
the forming a fluorine-containing region is performed by radiating an electromagnetic wave including infrared light to the semiconductor layer.

10. The method of producing a semiconductor device according to claim 9, wherein
the electromagnetic wave including infrared light is radiated to a surface on which the recess is formed.

11. The method of producing a semiconductor device according to claim 1, wherein the forming a semiconductor layer comprises:
forming a first semiconductor layer on the substrate; and
forming a second semiconductor layer on the first semiconductor layer, and
the fluorine-containing region is formed in a portion of the second semiconductor layer, the portion corresponding to the bottom surface of the recess.

12. The method of producing a semiconductor device according to claim 1, wherein
the forming a semiconductor layer comprises:
forming a first semiconductor layer on the substrate;
forming a third semiconductor layer on the first semiconductor layer; and
forming a second semiconductor layer on the third semiconductor layer, and
the fluorine-containing region is formed in a portion of one of the second semiconductor layer and the third semiconductor layer, the portion corresponding to the bottom surface of the recess.

13. The method of producing a semiconductor device according to claim 11, wherein
the forming a semiconductor layer further comprises forming a fourth semiconductor layer on the second semiconductor layer, and
the forming a recess in the semiconductor layer further includes forming the recess by removing the fourth semiconductor layer at the opening portion.

14. The method of producing a semiconductor device according to claim 11, the method further comprising:
forming a source electrode and a drain electrode of a HEMT or a MIS transistor in contact with one of the first semiconductor layer and the second semiconductor layer, the forming a source electrode and a drain electrode being performed after the forming an electrode, wherein the electrode includes a gate electrode of the HEMT or the MIS transistor over the recess.

15. The method of producing a semiconductor device according to claim 11, the method further comprising:
forming a source electrode and a drain electrode of the HEMT or the MIS transistor in contact with one of the first semiconductor layer and the second semiconductor layer, the forming a source electrode and a drain electrode being performed after the forming a semiconductor layer and before the forming a recess, wherein the electrode includes a gate electrode of the HEMT or the MIS transistor over the recess.

* * * * *